US012571116B2

(12) United States Patent
Ehsan et al.

(10) Patent No.: US 12,571,116 B2
(45) Date of Patent: Mar. 10, 2026

(54) NICKEL-IRON-OXIDE THIN FILMS AS AN ELECTROCATALYST FOR WATER OXIDATION

(71) Applicant: KING FAHD UNIVERSITY OF PETROLEUM AND MINERALS, Dhahran (SA)

(72) Inventors: Muhammad Ali Ehsan, Dhahran (SA); Abbas Saeed Hakeem, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 475 days.

(21) Appl. No.: 18/333,606

(22) Filed: Jun. 13, 2023

(65) Prior Publication Data

US 2024/0417871 A1 Dec. 19, 2024

(51) Int. Cl.
| | |
|---|---|
| *C25B 11/052* | (2021.01) |
| *C23C 16/40* | (2006.01) |
| *C23C 16/448* | (2006.01) |
| *C25B 1/04* | (2021.01) |
| *C25B 9/17* | (2021.01) |
| *C25B 11/031* | (2021.01) |

(Continued)

(52) U.S. Cl.
CPC .......... *C25B 11/052* (2021.01); *C23C 16/406* (2013.01); *C23C 16/4486* (2013.01); *C25B 1/04* (2013.01); *C25B 9/17* (2021.01); *C25B 11/031* (2021.01); *C25B 11/037* (2021.01); *C25B 11/061* (2021.01); *C25B 11/077* (2021.01)

(58) Field of Classification Search
CPC ....... C25B 11/031; C25B 1/04; C25B 11/077; C25B 11/037
See application file for complete search history.

(56) References Cited

U.S. PATENT DOCUMENTS

2023/0010138 A1 1/2023 Zhifeng et al.

FOREIGN PATENT DOCUMENTS

| CN | 110863211 B | 4/2021 |
|---|---|---|
| CN | 113774427 A | 12/2021 |
| CN | 114990616 A | 9/2022 |

OTHER PUBLICATIONS

Jianying Wang, et al., "In Situ Rapid Formation of a Nickel-Iron-Based Electrocatalyst for Water Oxidation", ACS Catalysis, vol. 6, Issue 10, Sep. 9, 2016, pp. 6987-6992.

(Continued)

*Primary Examiner* — Brian W Cohen
(74) *Attorney, Agent, or Firm* — Oblon, McClelland, Maier & Neustadt, L.L.P.

(57) ABSTRACT

A method of generating oxygen including applying a potential of greater than 0 to 2.0 V to an electrochemical cell, where the electrochemical cell is at least partially submerged in an aqueous solution, and where on applying the potential the aqueous solution is oxidized thereby forming oxygen. The electrochemical cell includes an electrocatalyst; and a counter electrode. The electrocatalyst includes a nickel foam substrate; and a layer of particles of $FeNiO_x$ on a surface of the nickel foam substrate, wherein x=3-4. The particles of $FeNiO_x$ have a nanorod shape with an average diameter of 100-500 nanometers (nm) and a length longer than 500 nm. The terminal end of the nanorod shape has a cap with a hemispherical shape having a diameter larger than the average diameter of the nanorod shape.

18 Claims, 14 Drawing Sheets

500 nm

(51) Int. Cl.
    *C25B 11/037*      (2021.01)
    *C25B 11/061*      (2021.01)
    *C25B 11/077*      (2021.01)

(56)             References Cited

OTHER PUBLICATIONS

Guang Liu, et al., "Mesoporous nickel-iron binary oxide nanorods for efficient electrocatalytic water oxidation", Nano Research, vol. 10, Mar. 1, 2017, pp. 2096-2105 (Abstract only).
Heramba V. S. R. M. Koppisetti, et al., "Fe-Rich $Ni_{0.06}Fe_{0.94}OOH$ Nanorods as Efficient Electrocatalysts for the Oxygen Evolution Reaction", ACS Applied Energy Materials, vol. 5, Issue 2, Feb. 2, 2022, pp. 1681-1689 (Abstract only).
Guang Liu, et al., "Ni/NiFe2O4 nanorods encapsulated in onion-like N-doped carbon nanolayers as efficient oxygen evolution electrocatalyst", Chinese Journal of Inorganic Chemistry, vol. 34, Issue 8, Jan. 2018, pp. 1494-1500 (Abstract only).

NICKEL-IRON-OXIDE THIN FILMS AS AN ELECTROCATALYST FOR WATER OXIDATION

STATEMENT OF ACKNOWLEDGEMENT

Use of research facilities provided by the Interdisciplinary Research Center for Hydrogen and Energy Storage (IRC-HES) at King Fahd University of Petroleum and Minerals (KFUPM) is gratefully acknowledged.

BACKGROUND

Technical Field

The present disclosure is directed to an electrocatalyst, particularly to a method of generating oxygen using nickel-iron-oxide thin films as an electrocatalyst.

Description of Related Art

The "background" description provided herein is to present the context of the disclosure generally. Work of the presently named inventors, to the extent it is described in this background section, as well as aspects of the description that may not otherwise qualify as prior art at the time of filing, are neither expressly nor impliedly admitted as prior art against the present invention.

Hydrogen is widely recognized as a renewable and sustainable energy source due to its properties, such as high energy density, non-polluting, and lightweight nature. It is abundantly available in water and can be produced by breaking the bond between oxygen and hydrogen. This process, known as electrochemical water splitting, is a two-step process including hydrogen evolution reaction (HER) and oxygen evolution reaction (OER) steps, which happen at the cathode and anode, respectively. Of these, more importance is given to OER because of its complicated electron-proton shifting process, which slows down the reaction kinetics and requires a high over-potential to achieve. To minimize these over-potentials, highly efficient, long-lived, inexpensive, and abundant electrocatalyst materials are required. Some rare earth metal oxides ($IrO_2$, $RuO_2$, etc.) are known as top-level catalysts for OER processes, but their high price and insufficient supply limit their utilization for large-scale applications. Therefore, developing affordable and sustainable electrocatalyst materials is necessary.

In this regard, electrocatalysts with first-row 3d transition metals (Fe, Co, and Ni) and their corresponding oxides, hydroxides, oxyhydroxides, sulfide/selenide nitrides, and other analogs have been investigated. In particular, nickel-iron oxide has gained significant interest for water oxidation, and its catalytic activity outperforms many oxide materials in alkaline media. Despite advances in NiFe-based catalysts, there is still great interest in improving the catalytic activity and stability by modifying the preparation and morphology of the catalyst.

In view of the forgoing, one objective of the present invention is to provide an electrocatalyst including NiFe. It is another object of the present disclosure to provide a NiFe electrocatalyst with a cheap and efficient method of making.

SUMMARY

In an exemplary embodiment, a method of generating oxygen is described. The method includes applying a potential of greater than 0 to 2.0 V to an electrochemical cell, wherein the electrochemical cell is at least partially submerged in an aqueous solution, wherein on applying the potential the aqueous solution is oxidized, thereby forming oxygen. The electrochemical cell includes an electrocatalyst; and a counter electrode. The electrocatalyst includes a nickel foam substrate; and a layer of particles of $FeNiO_x$ on the surface of the nickel foam substrate, wherein x=3-4. The particles of $FeNiO_x$ have a nanorod shape with an average diameter of 100-500 nanometers (nm) and a length longer than 500 nm. The terminal end of the nanorod shape has a cap with a hemispherical shape having a diameter larger than the average diameter of the nanorod shape.

In some embodiments, the $FeNiO_x$ has a formula of $Ni_{1.25}Fe_{1.85}O_4$.

In some embodiments, the particles of $FeNiO_x$ have a nanorod shape with a length of 1-10 μm.

In some embodiments, the cap with the hemispherical shape has a diameter that is 20-60 nm larger than the diameter of the nanorod shape.

In some embodiments, the particles of $FeNiO_x$ are not hollow.

In some embodiments, the particles of $FeNiO_x$ are randomly oriented on the surface of the nickel foam substrate and form an interconnected and continuous fiber network.

In some embodiments, the particles of $FeNiO_x$ comprise 60-80 at. % O, 10-20 at. % Fe, and 5-15 wt. % Ni, based on the total number of atoms in the $FeNiO_x$.

In some embodiments, the electrocatalyst has an overpotential of 210-240 millivolts (mV) for a current density of 10 milliamperes per square centimeter (mA cm$^{-2}$).

In some embodiments, the overpotential does not vary by more than 5% after the potential is applied for 2-50 hours.

In some embodiments, the electrocatalyst has a current density of at least 1,000 mA cm$^{-2}$ at 1.6 V.

In some embodiments, a method of forming the electrocatalyst is described. The method includes mixing a nickel salt and an iron salt in a solvent to form a homogeneous solution; and depositing the homogeneous solution on the nickel foam substrate by aerosol-assisted chemical vapor deposition (AACVD) at a temperature of 400-600° C. to form the electrocatalyst.

In some embodiments, the method includes depositing the homogeneous solution on the nickel foam substrate for 10-100 minutes.

In some embodiments, the method includes mixing the nickel salt and the iron salt are present in a 1-10:1-10 molar ratio.

In some embodiments, the electrocatalyst consists of $FeNiO_x$ on the surface of the nickel foam substrate.

In some embodiments, the aqueous solution includes at least one base selected from the group consisting of an alkaline earth metal hydroxide and an alkali metal hydroxide.

In some embodiments, the base is potassium hydroxide.

In some embodiments, the counter electrode is made from a material selected from the group consisting of platinum, gold, and carbon.

In some embodiments, 80-99% of the nickel foam substrate is porous.

The foregoing general description of the illustrative present disclosure and the following The detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

Figures 7A, 7B:
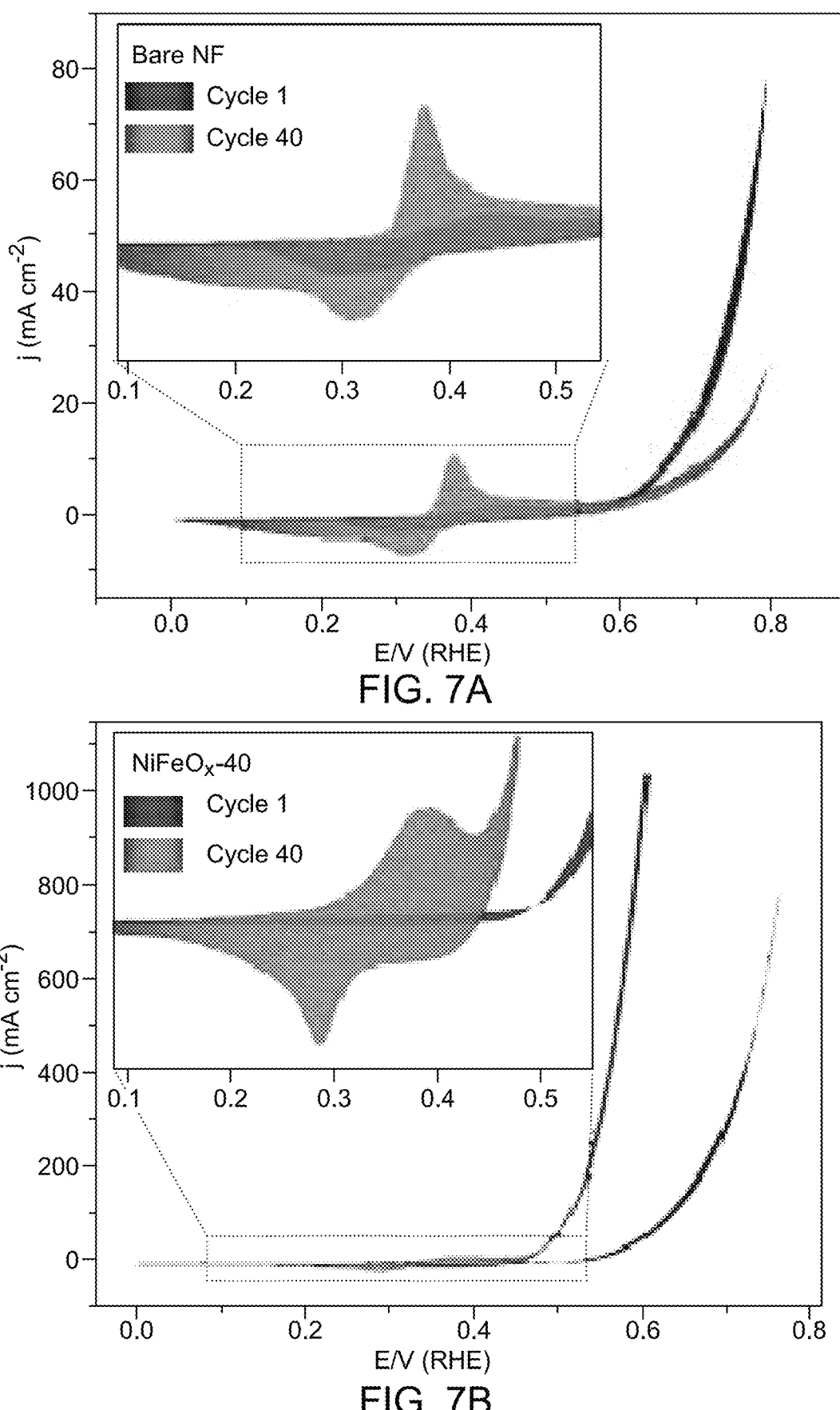
FIG. 7A shows catalytic activation of a bare nickel foam (NF) substrate via continuous cyclic voltammetry (CV) sweeping of 40 cycles at a scan rate of 50 mV $sec^{-1}$ in 1.0 M KOH electrolyte, according to certain embodiments.
FIG. 7B shows catalytic activation of $FeNiO_x$ catalyst via continuous CV sweeping of 40 cycles at a scan rate of 50 mV $sec^{-1}$ in 1.0 M KOH electrolyte for a bare $FeNiO_x$-40 catalyst, according to certain embodiments.
Figures 7C, 7D:
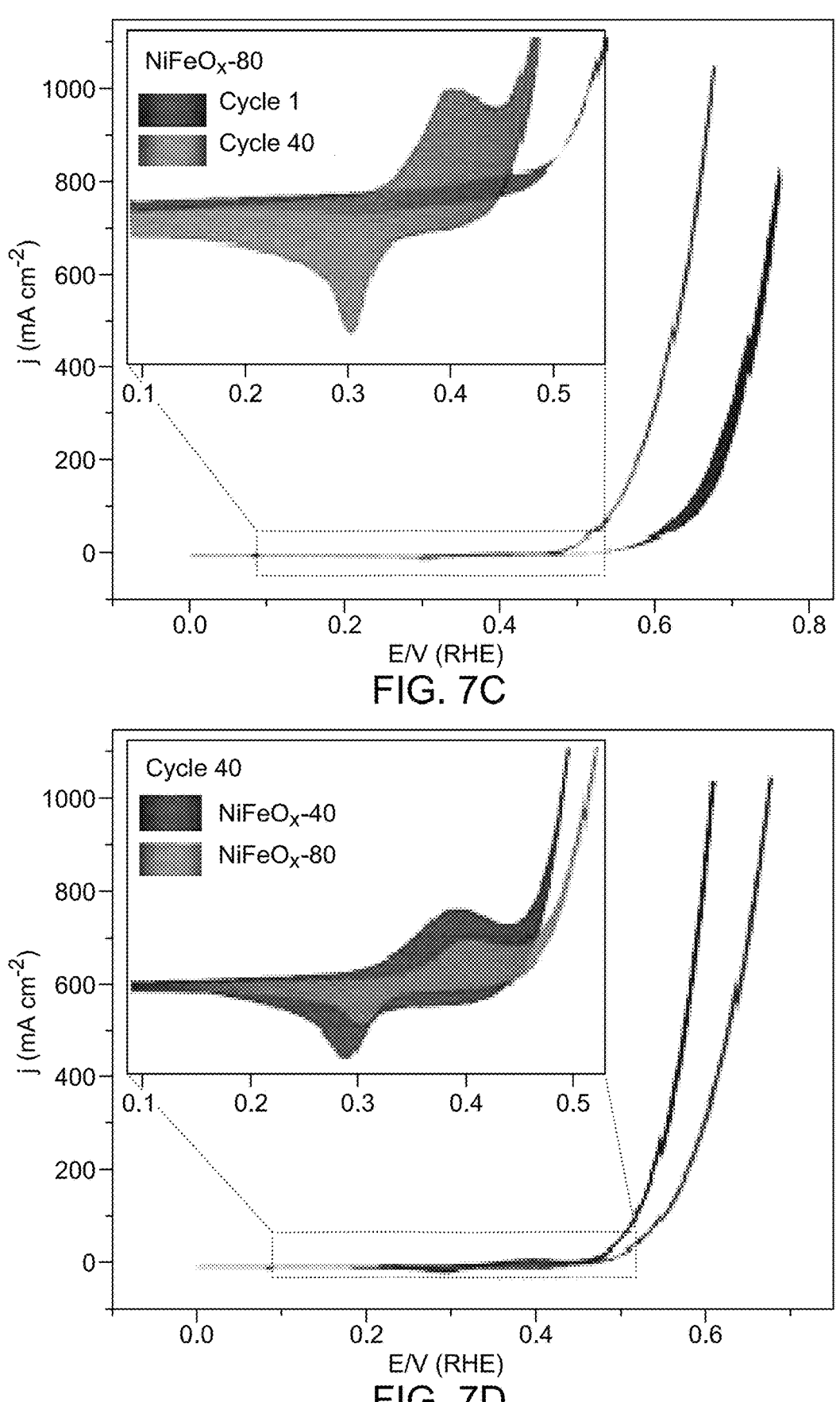
FIG. 7C shows catalytic activation of $FeNiO_x$ catalysts via continuous CV sweeping of 40 cycles at a scan rate of 50 mV $sec^{-1}$ in 1.0 M KOH electrolyte for a bare $FeNiO_x$-80 catalyst, according to certain embodiments.
Figure 8A:
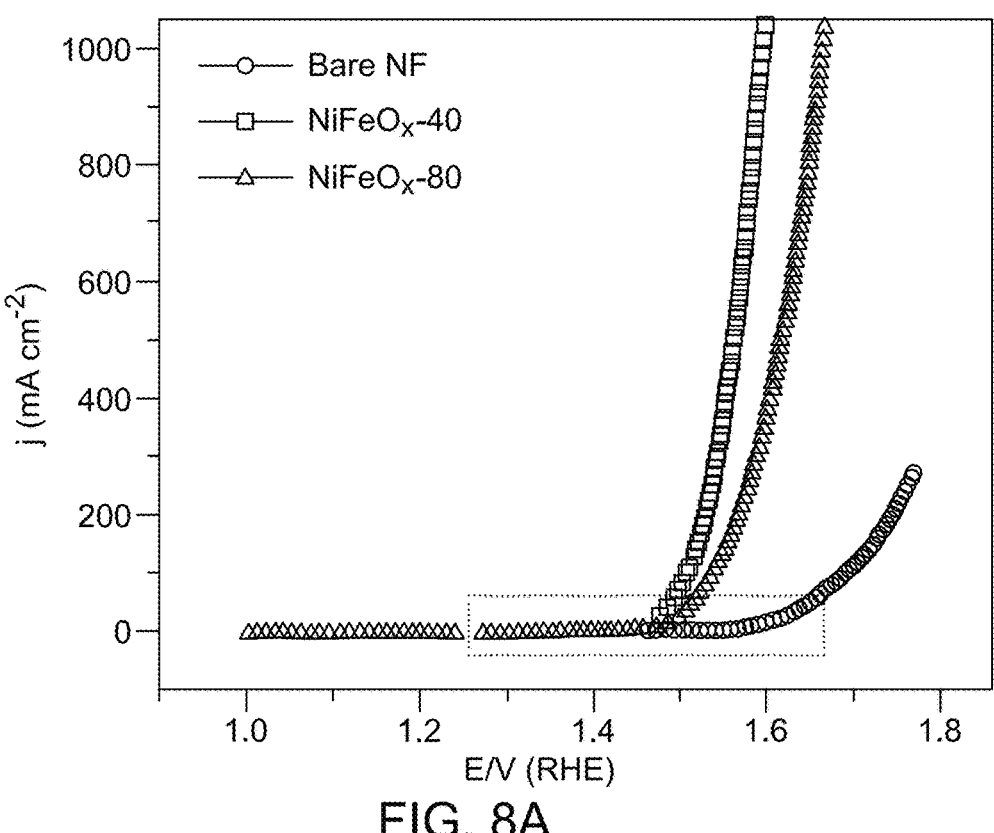
Figure 8B:
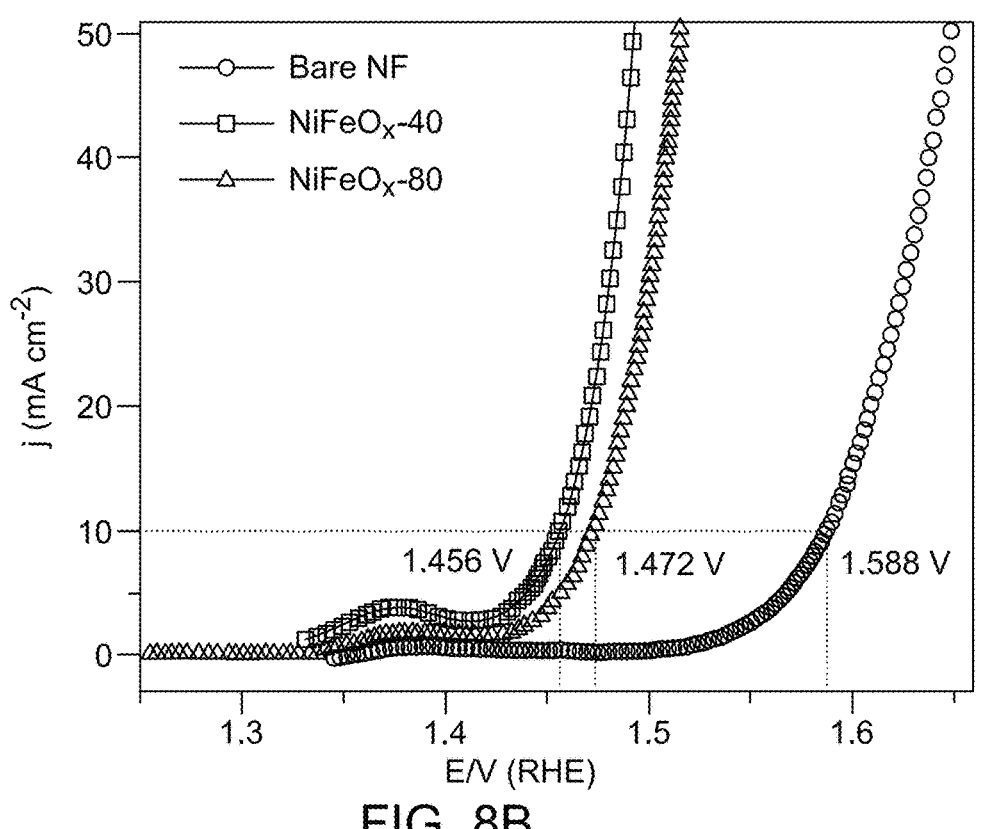
Figure 8C:
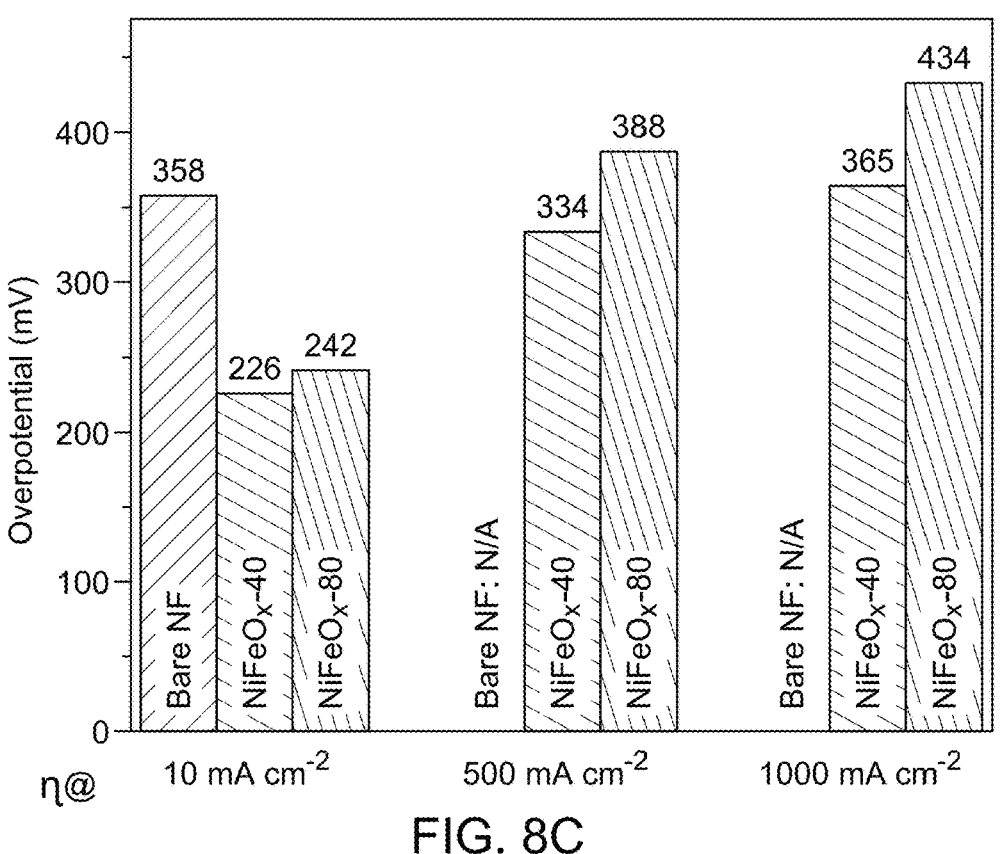
Figure 8D:
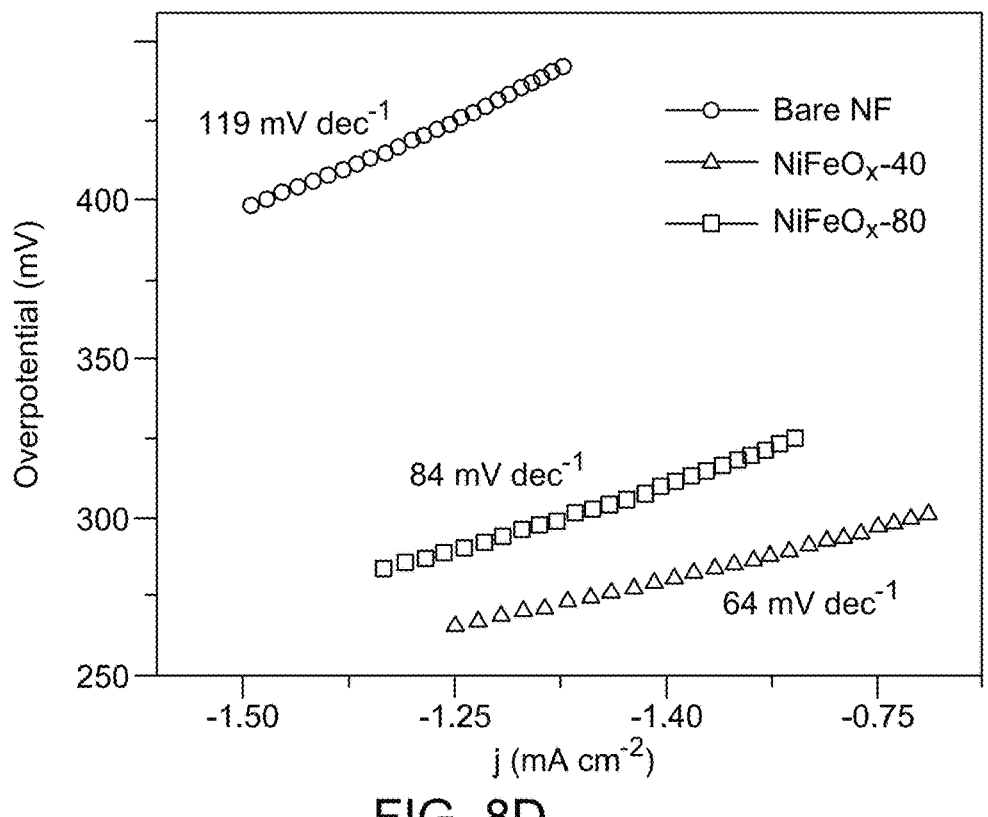
Figure 9A:
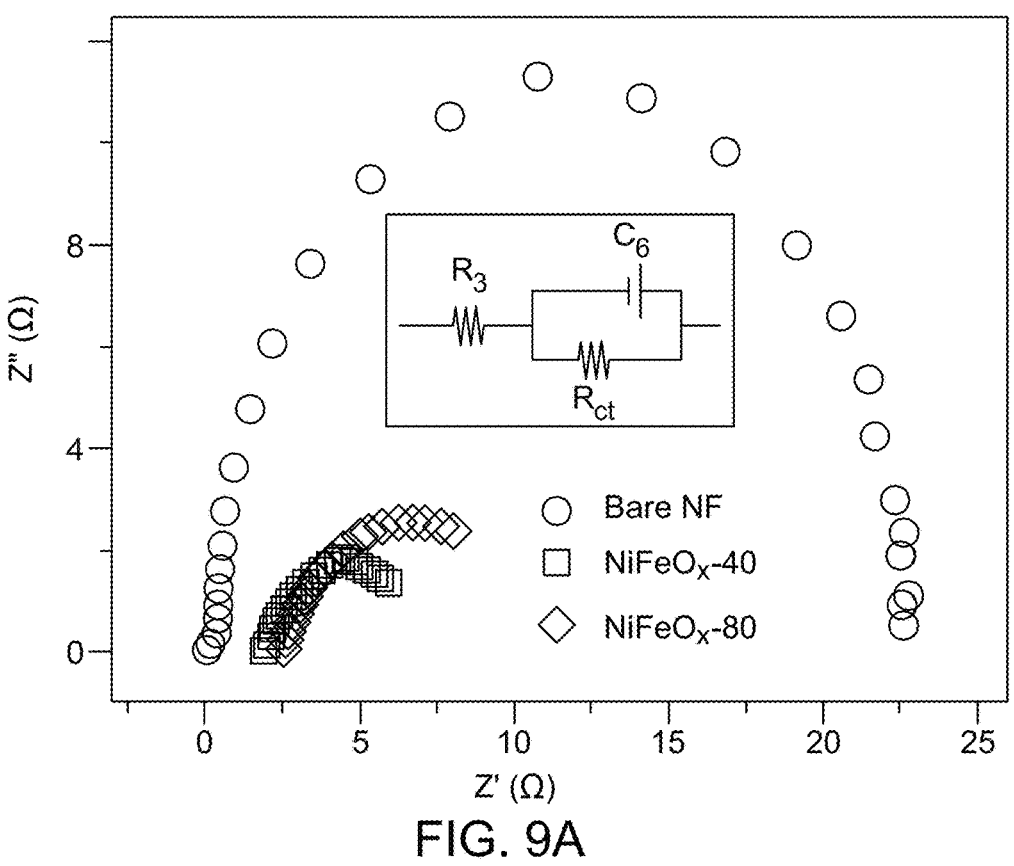
Figure 9B:
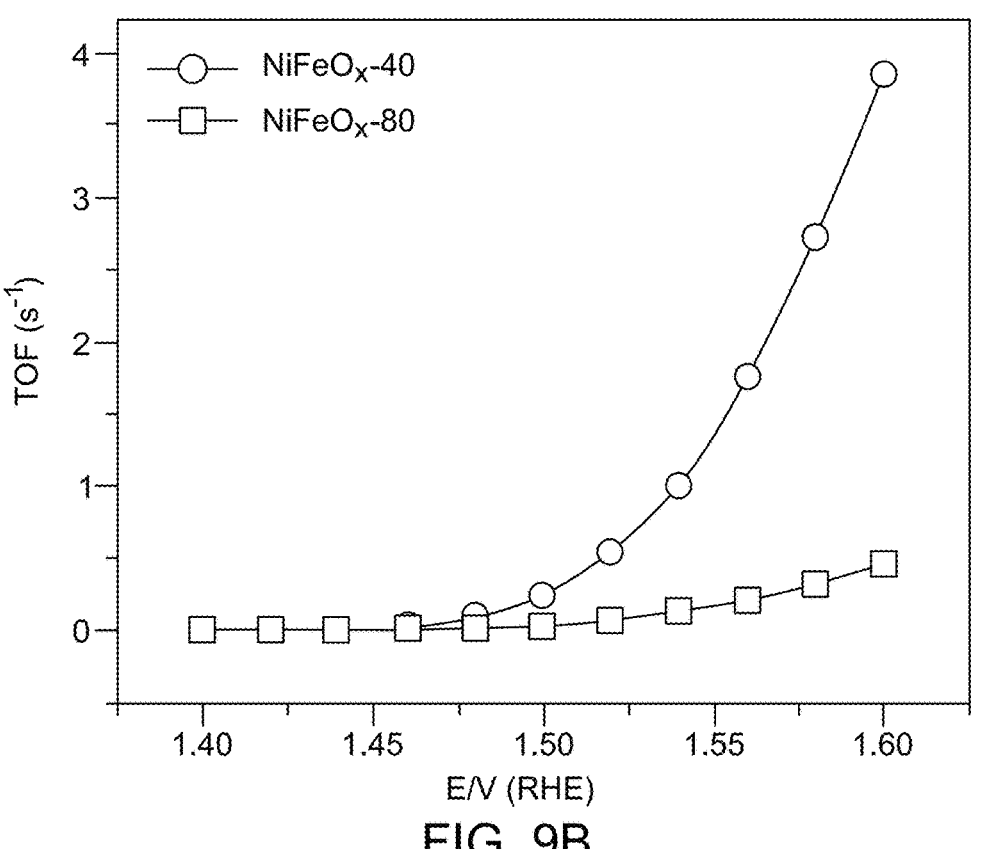
Figure 9C:
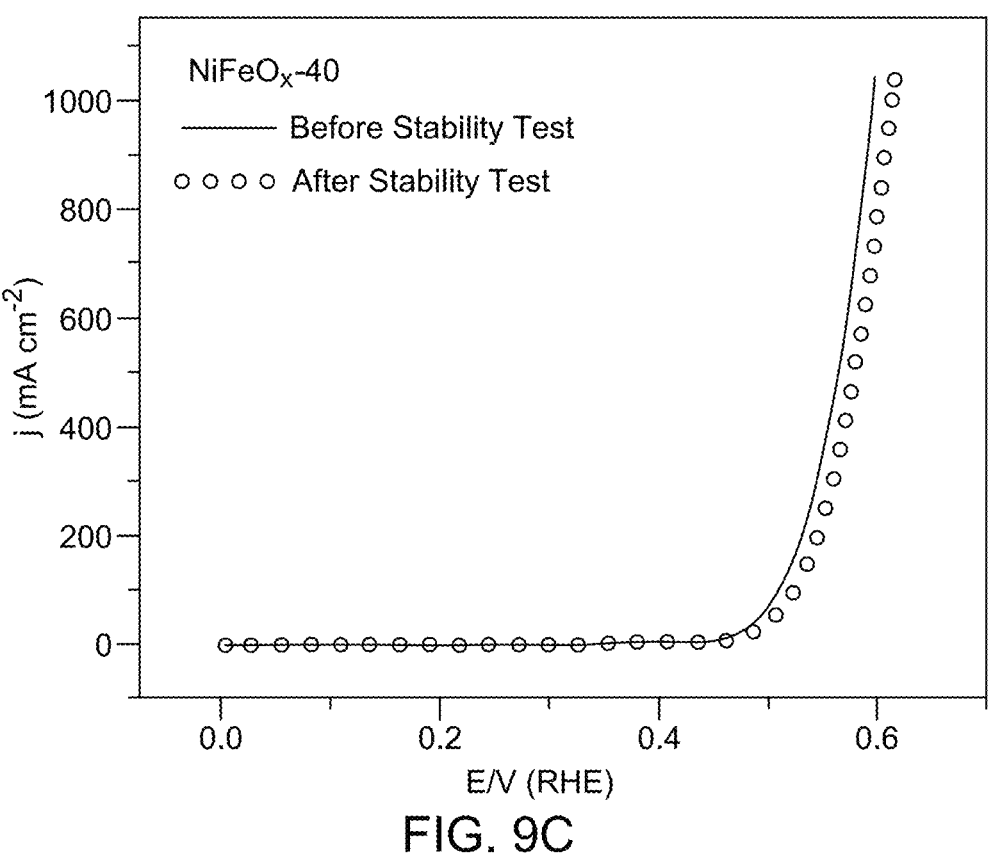
Figure 9D:
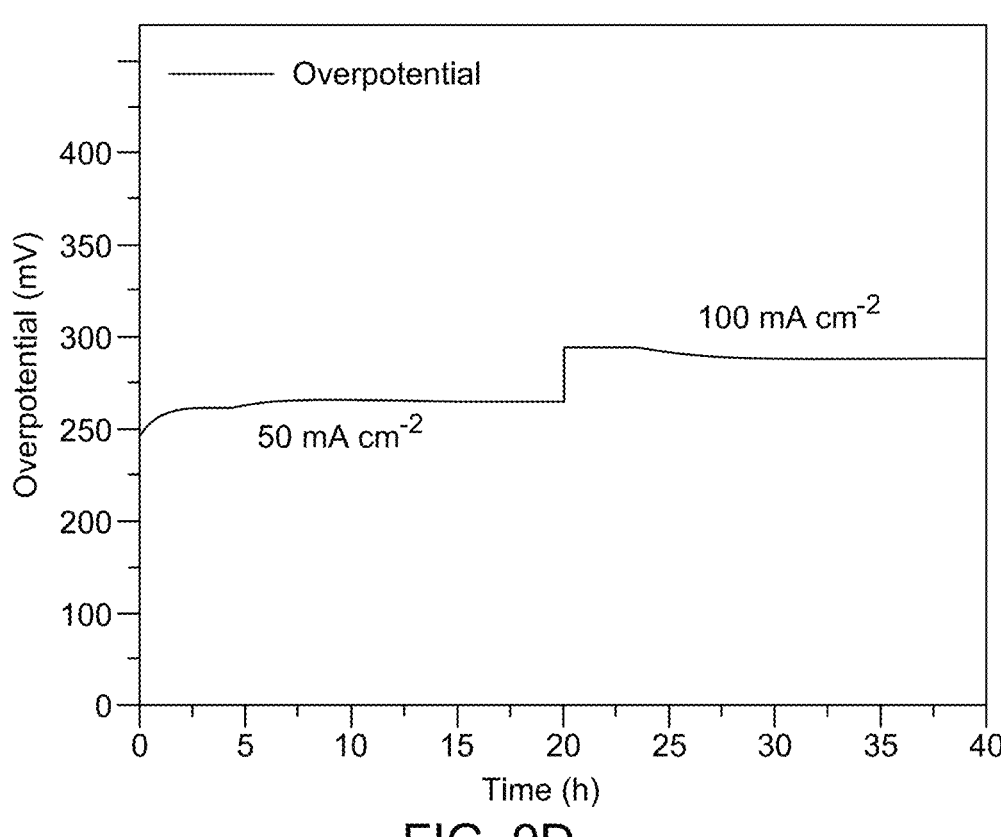

FIG. 7D shows a comparison between 40th CV cycle between $FeNiO_x$-40 and $FeNiO_x$-80 catalyst, according to certain embodiments;

FIG. 8A shows polarization curves of $FeNiO_x$ catalysts recorded at a scan rate of 1 mV/s, according to certain embodiments;

FIG. 8B shows an inflated view of FIG. 8A, according to certain embodiments;

FIG. 8C shows over-potential values at different current densities for the bare NF and $FeNiO_x$ electrodes, according to certain embodiments;

FIG. 8D shows Tafel plots and corresponding Tafel slope values for the bare NF and the $FeNiO_x$ catalysts, according to certain embodiments;

FIG. 9A shows electrochemical impedance spectroscopy (EIS) Nyquist plots for the $FeNiO_x$ electrocatalysts and an inset showing a Randles circuit fitting, according to certain embodiments;

FIG. 9B shows turnover frequency (TOF) values of the $FeNiO_x$ catalysts determined from corresponding linear sweep voltammetry (LSV), according to certain embodiments;

FIG. 9C shows the stability of $FeNiO_x$ catalysts after working at different applied current densities, according to certain embodiments; and FIG. 9D shows polarization curves of the $FeNiO_x$ catalysts before and after endurance tests, according to certain embodiments.

DETAILED DESCRIPTION

In the drawings, reference numerals designate identical or corresponding parts throughout the several views. Further, as used herein, the words "a," "an," and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Where a numerical limit or range is stated herein, the endpoints are included. Also, all values and subranges within a numerical limit or range are specifically included as if explicitly written out.

As used herein, "compound" is intended to refer to a chemical entity, whether as a solid, liquid, or gas, and whether in a crude mixture or isolated and purified.

As used herein, "particle size" and "pore size" may be thought of as the lengths or longest dimensions of a particle and of a pore opening, respectively.

As used herein, the term "electrode" refers to an electrical conductor used to contact a non-metallic part of a circuit e.g., a semiconductor, an electrolyte, a vacuum, or air.

As used herein, the term "current density" refers to the amount of electric current traveling per unit cross-section area.

As used herein, the term "Tafel slope" refers to the relationship between the overpotential and the logarithmic current density.

As used herein, the term "aerosolizing" refers to a process of intentionally oxidatively converting solution for the purpose of delivering the oxidized aerosols to the heating chamber.

As used herein, the term "aerosol" refers to extremely small solid particles, or very small liquid droplets, suspended in the atmosphere.

As used herein, the term "electrochemical cell" refers to a device capable of either generating electrical energy from chemical reactions or using electrical energy to cause chemical reactions.

As used herein, the term "water splitting" refers to the chemical reaction in which water is broken down into oxygen and hydrogen.

$$2H_2O \rightarrow 2H_2 + O_2$$

The present disclosure is intended to include all hydration states of a given compound or formula unless otherwise noted or when heating a material.

In addition, the present disclosure is intended to include all isotopes of atoms occurring in the present compounds and complexes. Isotopes include those atoms having the same atomic number but different mass numbers. By way of general example, and without limitation, isotopes of hydrogen include deuterium and tritium. Isotopes of naturally occurring nickel $^{28}Ni$ include $^{58}Ni$, $^{60}Ni$, $^{61}Ni$, $^{62}Ni$, and $^{64}Ni$. Isotopes of iron include $^{54}Fe$, $^{56}Fe$, $^{57}Fe$, and $^{58}Fe$. Isotopes of oxygen include $^{16}O$, $^{17}O$, and $^{18}O$. Isotopically-labeled compounds of the disclosure may generally be prepared by conventional techniques known to those skilled in the art or by processes analogous to those described herein, using an appropriate isotopically-labeled reagent in place of the non-labeled reagent otherwise employed.

Aspects of the present disclosure are directed to the development of earth-rich, noble-metal-free, and highly electroactive catalysts to accelerate the oxygen evolution reaction (OER) of water-splitting technologies. The method of the present disclosure is a cost-effective and simple strategy to fabricate FeNiO$_x$ electrocatalysts for water splitting.

According to an aspect of the present disclosure, an electrocatalyst, also referred to as a catalyst, is described. The electrocatalyst includes a substrate onto which is dispersed a layer of metallic particles. In an embodiment, the substrate is made from at least one metal selected from the group consisting of Mn, Fe, Co, and Ni. In an embodiment, the substrate is in the form of a foam, a mesh, or a solid metal sheet. As used herein a metal foam is a cellular structure consisting of a solid metal with gas-filled pores comprising a large portion of the volume. In a preferred embodiment, the substrate is nickel foam (NF). In an embodiment, at least 80-99% of the nickel foam substrate is porous, preferably 85%, 90%, or 95%. In an embodiment, the average pore size of the NF substrate is about 50 to 500 micrometers (μm), preferably 100-400 μm, or about 200-300 μm. In an embodiment, the substrate has a thickness of 0.1 to 10 mm, preferably 0.5 to 8 mm, 1 to 5 mm or 2-3 mm. Also, the pores may have many shapes, such as cubical, conical, cuboidal, pyramidical, or cylindrical. In an embodiment, the pores of the NF substrate have a spherical shape.

The electrocatalyst includes a layer of particles of FeNiO$_x$ that at least partially covers the surface of the NF substrate. In a preferred embodiment, at least 90% of the outer surface area of the nickel foam substrate is covered with a layer of FeNiO$_x$ particles, preferably 92%, 94%, 96%, 98%, or 100%. The layer of the FeNiO$_x$ particles on the nickel foam substrate has a thickness of 0.01 μm to 50 μm, more preferably 10 to 45 μm, and yet more preferably 25 to 35 μm. It is preferred that the FeNiO$_x$ particles form a uniform layer that completely covers the surface of the NF substrate.

In some embodiments, the particles of FeNiO$_x$ comprise Fe, Ni and O, where x=3-4. In a preferred embodiment the FeNiO$_x$ has a formula of Ni$_{1.25}$Fe$_{1.85}$O$_4$. In some embodiments, the FeNiO$_x$ particles include 60-80 at. %, preferably 70-75 at. %, preferably about 74 at. % of O; 10-20 at. %, preferably 12-18 at. %, preferably 16-17 at. % of Fe; and 5-15 wt. %, preferably 5-10 at. %, preferably 9-10 at. % of Ni, based on the total number of atoms in the FeNiO$_x$. In some embodiments, the particles of FeNiO$_x$ further comprise another transition metal selected from the group consisting of scandium, titanium, vanadium, chromium, manganese, cobalt, copper, and zinc. In a preferred embodiment, the particles of FeNiO$_x$ consist of Fe, Ni and O.

In some embodiments, the electrocatalyst includes a co-catalyst. In an especially preferred embodiment, the electrocatalyst does not include a co-catalyst. As used herein, the term 'co-catalyst' refers to the substance or agent that brings about catalysis in conjunction with one or more others. In a more preferred embodiment, the co-catalyst does not include platinum. In the most preferred embodiment, the co-catalyst does not include any precious metals such as gold, silver, ruthenium, rhodium, palladium, osmium, iridium, and platinum. In a more preferred embodiment, the substrate and catalyst do not include platinum. In the most preferred embodiment, the substrate and catalyst do not include any precious metals such as gold, silver, ruthenium, rhodium, palladium, osmium, iridium, and platinum. In a preferred embodiment, the electrocatalyst consists of FeNiO$_x$ on the surface of the nickel foam substrate.

In some embodiments, the FeNiO$_x$ particles are in the form of nanorods. The FeNiO$_x$ nanorods are not hollow and have a dense structure throughout of the FeNiO$_x$. In some embodiments, the FeNiO$_x$ particles may exist in other morphological forms such as nanowires, nanocrystals, nanorectangles, nanotriangles, nanopentagons, nanohexagons, nanoprisms, nanodisks, nanocubes, nanoribbons, nanoblocks, nanobeads, nanotoroids, nanodiscs, nanobarrels, nanogranules, nanowhiskers, nanoflakes, nanofoils, nanopowders, nanoboxes, nanostars, tetrapods, nanobelts, nano-urchins, nanofloweres, etc. and mixtures thereof. In some embodiments, at least 80 wt. % of FeNiO$_x$ particles, preferably at least 85 wt. % of FeNiO$_x$ particles, preferably at least 90 wt. % of FeNiO$_x$ particles, preferably at least 95 wt. % of FeNiO$_x$ particles are in the form of nanorods. In some embodiments, the FeNiO$_x$ particles are crystalline. Crystalline means that the FeNiO$_x$ particles include at least 90 wt %, preferably at least 95 wt %, more preferably at least 99 wt % crystalline FeNiO$_x$ particles relative to the total weight of the FeNiO$_x$ particles.

The nanorods have an average diameter of 100-500 nanometers (nm), preferably 200-450 nm, preferably 300-400 nm, and yet more preferably about 400 nm. The nanorods have a length longer than 500 nm. In some embodiments, the nanorods have a length in a range of 1-10 μm, preferably 2-9 μm, 3-8 μm, 4-7 μm, or 5-6 μm. In some embodiments, the terminal end of the nanorod shape has a cap with a hemispherical shape having a diameter larger than the average diameter of the nanorod shape. In some embodiments, one terminal end of the nanorod has a cap or both terminal ends have a cap. In some embodiments, the cap with the hemispherical shape has a diameter that is 20-60 nm larger, preferably 30-50 nm, or about 40 nm larger than the diameter of the nanorod shape. In other words, if the nanorod has a diameter of 200 nm throughout the length of the nanorod, a terminal end has a hemispherical cap with a diameter of 220-260 nm.

In some embodiments, the particles of FeNiO$_x$ are randomly oriented on the surface of the nickel foam substrate. In some embodiments, the particles of FeNiO$_x$ are oriented vertically or horizontally on the surface of the nickel foam substrate. In some embodiments, the particles of FeNiO$_x$ form an interconnected and continuous fiber network. In other words, there are not islands of the nanorods but rather they are continuously connected.

Figure 1:
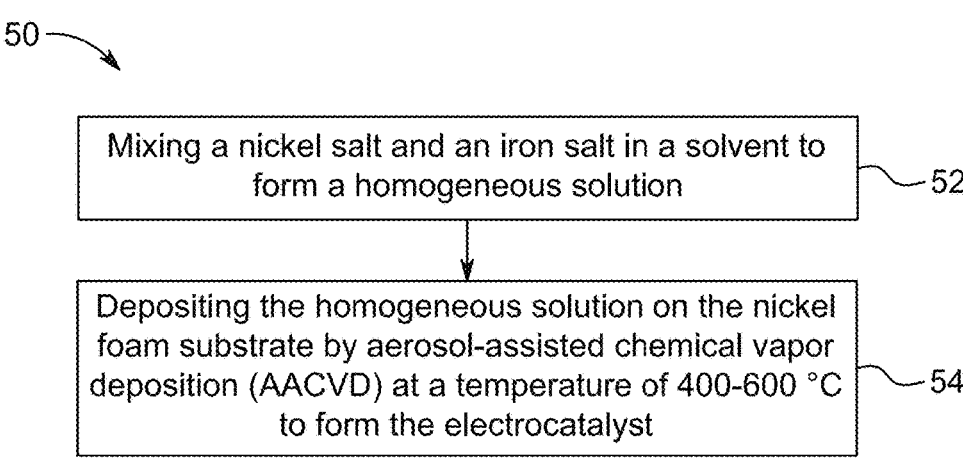
FIG. 1 is a flowchart depicting a method of forming an electrocatalyst, according to certain embodiments.

FIG. 1 illustrates a flow chart of a method 100 of preparing the electrocatalyst. The order in which the method 100 is described is not intended to be construed as a limitation, and any number of the described method steps can be combined in any order to implement the method 100. Additionally, individual steps may be removed or skipped from the method 100 without departing from the spirit and scope of the present disclosure.

At step 102, the method 100 includes mixing a nickel salt and an iron salt in a solvent to form a homogeneous solution. Suitable examples of iron salts include ferrous sulfate, ferric sulfate; ferrous chloride; ferric nitrate; ferrous nitrate; ferric sulfate; ferric chloride; iron (III) acetylacetonate (Fe(acac)$_3$), iron acetate, and mixtures and hydrates thereof. Preferably the iron salt is iron acetylacetonate. Suitable examples of Ni salts include, but are not limited to, nickel (II) nitrate, nickel (II) acetate, nickel (II) acetylacetonate, nickel (II) hexafluoroacetylacetonate, nickel (II) octanoate, ammonium nickel (II) sulfate, nickel (II) chloride, nickel (II) bromide, nickel (II) fluoride, nickel (II) iodide, nickel (II) carbonate, nickel (II) hydroxide, nickel (II) perchlorate, nickel (II) sulfate, nickel (II) sulfamate, and mixtures and hydrates thereof. Preferably, Ni salt is nickel (II) acetylacetonate. In some embodiments, the nickel salt and the iron salt are mixed in a 1-10:1-10 molar ratio, preferably 1:5 to 5:1 molar ratio, preferably 1:4 to 4:1 molar ratio, preferably 3:1 to 1:3 molar ratio, preferably 1: to 2:1 molar ratio, and more preferably a 1:1 molar ratio, in the solvent. The solvent is at least one selected from the group consisting of a ketone solvent, an ester solvent, an alcohol solvent, an amide solvent, and an ether solvent. In some embodiments, the solvent is the alcohol solvent. In some embodiment, the alcohol solvent is at least one selected from the group consisting of methanol, ethanol, n-propanol, and isopropanol. The mixing may be carried out manually or with the help of a stirrer. It is carried out till the nickel salt and the iron salt are fully dissolved in the solvent, methanol, resulting in a homogenous solution.

At step 104, the method includes depositing the homogeneous solution on the nickel foam substrate by aerosol-assisted chemical vapor deposition (AACVD) at a temperature of 400-600° C. to form the electrocatalyst. The AACVD process involves atomizing the homogenous solution into fine, sub-micrometer-sized aerosol droplets, which are delivered to a heated reaction zone, where the aerosol droplets undergo evaporation, decomposition, and homogeneous and/or heterogeneous chemical reactions to form the desired products. Using the AACVD route, a batch of films with different thicknesses and morphologies can be fabricated in a concise time. This can be achieved by controlling parameters, such as deposition temperature, deposition time, gas carrier flow rate, precursor, and concentration of the precursor solution, to name a few. The aerosolizing process may be performed on an aerosol generator. Many different types of aerosol generators are known and may be used depending on the film desired. The AACVD process is maintained at a temperature range of 400 to 600° C., preferably 420-580° C., preferably 450 to 550° C., preferably 400-500° C., more preferably to about 475° C. At this temperature, the solvent from the aerosol evaporates, leaving behind the precursor. The thickness and morphology depends on how long the deposition process takes place. In an embodiment, the deposition process is carried out for a period of 10 minutes- 100 minutes, preferably 20-90 minutes, more preferably 40-80 minutes, to obtain the electrocatalyst.

In an embodiment, a method of generating oxygen is described. The method includes applying a potential of greater than 0 to 2.0 V preferably 0.2 to 1.8 V, 0.4 to 1.6 V, 0.6 to 1.4 V, 0.8 to 1.2 V, or about 1 V, to an electrochemical cell. On applying the potential the aqueous solution is oxidized, thereby forming oxygen. The electrochemical cell includes the electrocatalyst of the present disclosure, and a counter electrode. During the electrochemical process, the electrochemical cell is at least partially submerged preferably 50%, preferably at least 60%, 70%, 80%, 90%, or fully submerged in the aqueous solution.

The electrocatalyst forms the working electrode, while the counter electrode forms the auxiliary electrode. The outer surface of the counter electrode includes an inert, electrically conducting chemical substance, such as platinum, gold, or carbon. The carbon may be in the form of graphite or glassy carbon. Alternatively, the counter electrode may comprise some other electrically-conductive material such as platinum-iridium alloy, iridium, titanium, titanium alloy, stainless steel, gold, cobalt alloy, and/or some other electrically-conductive material, where an "electrically-conductive material" as defined here is a substance with an electrical resistivity of at most $10^{-6}$ $\Omega$·m, preferably at most $10^{-7}$ $\Omega$·m, more preferably at most $10^{-8}$ $\Omega$·m at a temperature of 20-25° C. In one embodiment, the counter electrode may be a wire, a rod, a cylinder, a tube, a scroll, a sheet, a piece of foil, a woven mesh, a perforated sheet, or a brush. The counter electrode material should thus be sufficiently inert to withstand the chemical conditions in the electrolyte solution, such as acidic or basic pH values, without substantially degrading during the electrochemical reaction. The counter electrode preferably should not leach out any chemical substance that interferes with the electrochemical reaction or lead to undesirable contamination of either electrode.

The aqueous solution includes water and an inorganic base. The base, also referred to as the electrolyte, is selected from the group consisting of an alkaline earth metal hydroxide such as beryllium hydroxide (Be(OH)$_2$), magnesium hydroxide (Mg(OH)$_2$), strontium hydroxide (Sr(OH)$_2$), and calcium hydroxide (Ca(OH)$_2$) and an alkali metal hydroxide such as lithium hydroxide (LiOH), sodium hydroxide (NaOH), potassium hydroxide (KOH) and rubidium hydroxide (RbOH), and cesium hydroxide (CsOH). In a preferred embodiment, the base is potassium hydroxide. The concentration of the base may lie in a range of about 0.1 molar (M) to 3 M, more preferably 1-2.5 M, and yet more preferably 1.5-2.5 M.

The water may be tap water, distilled water, bidistilled water, deionized water, deionized distilled water, reverse osmosis water, and/or some other water. In one embodiment, the water is bidistilled to eliminate trace metals. Preferably the water is bidistilled, deionized, deionized distilled, or reverse osmosis water and at 25° C. has a conductivity at less than 10 $\rho$S·cm$^{-1}$ preferably less than 1 $\mu$S·cm$^{-1}$, a resistivity greater than 0.1 M$\Omega$·cm, preferably greater than 1 M$\Omega$·cm, more preferably greater than 10 M$\Omega$·cm, a total solid concentration less than 5 mg/kg, preferably less than 1 mg/kg, and a total organic carbon concentration less than 1000 $\mu$g/L, preferably less than 200 $\mu$g/L, more preferably less than 50 $\mu$g/L.

In some embodiments, the working electrode and the counter-electrode are connected to each other by way of electrical interconnects that allow for the passage of current between the electrodes, when a potential is applied between them. In a preferred embodiment, the electrocatalyst (which forms the working electrode) and the counter electrode are at least partially submerged in the water and are not in physical contact with each other. In an embodiment, the working electrode and the counter-electrode can have the same or different dimensions. In certain embodiments, the working electrode has a cross-section diameter of 1.68 mm, and the counter-electrode as a cross-section diameter of 0.2 mm. The working electrode and the counter-electrode may be arranged as obvious to a person of ordinary skill in the art.

In one embodiment, the electrochemical cell further includes a reference electrode in contact with the aqueous solution. A reference electrode is an electrode that has a stable and well-known electrode potential. The high stability of the electrode potential is usually reached by employing a redox system with constant (buffered or saturated) concentrations of each relevant species of the redox reaction. A reference electrode may enable a potentiostat to deliver a stable voltage to the working electrode or the counter electrode. The reference electrode may be a standard hydrogen electrode (SHE), a normal hydrogen electrode (NHE), a reversible hydrogen electrode (RHE), a saturated calomel electrode (SCE), a copper-copper (II) sulfate electrode (CSE), a silver chloride electrode (Ag/AgCl), a pH-electrode, a palladium-hydrogen electrode, a dynamic hydrogen electrode (DHE), a mercury-mercurous sulfate electrode, or some other type of electrode. In a preferred embodiment, a reference electrode is present and is a silver chloride electrode (Ag/AgCl). However, in some embodiments, the electrochemical cell does not include a third electrode.

Preferably, to maintain uniform concentrations and/or temperatures of the aqueous solution, the aqueous solution may be stirred or agitated during the step of the subjecting. The stirring or agitating may be done intermittently or continuously. This stirring or agitating may be done by a magnetic stir bar, a stirring rod, an impeller, a shaking platform, a pump, a sonicator, a gas bubbler, or some other device. Preferably the stirring is done by an impeller or a magnetic stir bar.

Preferably, the $FeNiO_x$ electrocatalyst functions as the anode, receiving a positive potential to oxidize $OH^-$ into $O_2$ gas and $H_2O$, while the counter electrode functions as the cathode, receiving a negative potential to reduce water into $H_2$ gas and $OH^-$. This is summarized by the following reactions:

$$2H_2O_{(l)} + 2e^- \rightarrow H_{2(g)} + 2OH^-_{(aq)} \text{ Cathode (reduction)}$$

$$4OH^-_{(aq)} \rightarrow O_{2(g)} + 2H_2O_{(l)} + 4e^- \text{ Anode (oxidation)}$$

$$2H_2O_{(l)} \rightarrow 2H_{2(g)} + O_{2(g)} \text{ Overall reaction}$$

In another embodiment, the potentials may be switched, wherein the $FeNiO_x$ electrocatalyst functions as the cathode and receives a negative potential, and the counter electrode functions as the anode and receives a positive potential. In an alternative embodiment, the electrodes may be subjected to an alternating current (AC) in which the anode and cathode roles are continually switched between the two electrodes.

In one embodiment, the potential may be applied to the electrodes by a battery, such as a battery including one or more electrochemical cells of alkaline, lithium, lithium-ion, nickel-cadmium, nickel metal hydride, zinc-air, silver oxide, and/or carbon-zinc. In another embodiment, the potential may be applied through a potentiostat or some other source of direct current, such as a photovoltaic cell. In one embodiment, a potentiostat may be powered by an AC adaptor, which is plugged into a standard building or home electric utility line. In one embodiment, the potentiostat may connect with a reference electrode in the aqueous solution. Preferably the potentiostat is able to supply a relatively stable voltage or potential. For example, in one embodiment, the electrochemical cell is subjected to a voltage that does not vary by more than 5%, preferably by no more than 3%, preferably by no more than 1.5% of an average value throughout the subjecting. In another embodiment, the voltage may be modulated, such as being increased or decreased linearly, being applied as pulses, or being applied with an alternating current. Preferably, the $FeNiO_x$ electrode may be considered the working electrode, with the counter electrode being considered the auxiliary electrode. However, in some embodiments, the $FeNiO_x$ electrode may be considered the auxiliary electrode with the counter electrode.

In one embodiment, the method further comprises the step of separately collecting $H_2$-enriched gas and $O_2$-enriched gas. In one embodiment, the space above each electrode may be confined to a vessel in order to receive or store the evolved gases from one or both electrodes. The collected gas may be further processed, filtered, or compressed. Preferably the $H_2$-enriched gas is collected above the cathode, and the $O_2$-enriched gas is collected above the anode. The electrolytic cell, or an attachment, may be shaped so that the headspace above the $FeNiO_x$ electrocatalyst is kept separate from the headspace above the reference electrode. In one embodiment, the $H_2$-enriched gas and the $O_2$-enriched gas are not 100 vol % $H_2$ and 100 vol % $O_2$, respectively. For example, the enriched gases may also comprise $N_2$ from the air, water vapor, and other dissolved gases from the aqueous solution. The $H_2$-enriched gas may also comprise $O_2$ from the air. The $H_2$-enriched gas may comprise greater than 20 vol % $H_2$, preferably greater than 40 vol % $H_2$, more preferably greater than 60 vol % $H_2$, and even more preferably greater than 80 vol % $H_2$, relative to a total volume of the receptacle collecting the evolved $H_2$ gas. The $O_2$-enriched gas may comprise greater than 20 vol % $O_2$, preferably greater than 40 vol % $O_2$, more preferably greater than 60 vol % $O_2$, and even more preferably greater than 80 vol % $O_2$, relative to a total volume of the receptacle collecting the evolved $O_2$ gas. In some embodiments, the evolved gases may be bubbled into a vessel comprising water or some other liquid, and higher concentrations of $O_2$ or $H_2$ may be collected. In one embodiment, evolved $O_2$ and $H_2$, or $H_2$-enriched gas and $O_2$-enriched gas, may be collected in the same vessel.

Several parameters for the method for decomposing water may be modified to lead to different reaction rates, yields, and other outcomes. These parameters include but are not limited to, electrolyte type and concentration, pH, pressure, solution temperature, current, voltage, stirring rate, electrode surface area, size of $FeNiO_x$ particles, porosity, and exposure time. A variable DC current may be applied at a fixed voltage, or a fixed DC current may be applied at a variable voltage. In some instances, AC current or pulsed current may be used. A person having ordinary skill in the art may be able to adjust these and other parameters, to achieve different desired nanostructures. In other embodiments, the electrochemical cell may be used for other electrochemical reactions or analyses.

The electrocatalyst has an overpotential of 210-240 millivolts (mV) for a current density of 10 milliamperes per square centimeter (mA cm$^{-2}$). Also, the overpotential does not vary by more than 5%, preferably 4%, 3%, 2%, or 1% after the potential is applied for 2-50 hours, indicating the long-term stability of the electrocatalyst. Overpotential in electrolysis refers to the extra energy required than thermodynamically expected to drive a reaction. To make the process commercially viable, a low overpotential is required.

The FeNiO$_x$ electrocatalyst of the present disclosure has a current density of at least 1000 mA/cm$^2$, preferably 1100 or 1200 mA/cm$^2$ when the electrodes are subjected to a potential of 1.3-1.8 V, preferably 1.4-1.7 V, preferably 1.6 V. One factor for assessing OER kinetics is the Tafel slope. The Tafel slope shows how efficiently an electrode can produce current in response to a change in applied potential. Therefore, a low Tafel slope indicates that less overpotential is required to get a high current. The electrocatalyst has a Tafel slope of 64-84 m V/decade, preferably 65-80, or 70-75 mV/decade which is lower than the bare substrate (119 mV/decade), indicating that the electrode of the present disclosure facilitates the energy-intensive step during the OER process. In one embodiment, the FeNiO$_x$ electrode may have a higher current density than a bare electrode (nickel foam substrate or NF substrate), where the bare electrode has essentially the same structure without particles of FeNiO$_x$.

While not wishing to be bound to a single theory, it is thought that the unique capped nanorod structure made by the AACVD synthesis method improves catalytic activity. These caps on the nanorods increase an amount of active sites for water splitting compared to the bulk material. In addition, the interconnected porous structure can facilitate the fast diffusion of electrolytes, thereby accelerating the electrocatalytic reaction with the active sites on the bimetallic fibers. Overall, the interconnected and continuous fiber structure forms a network, which provides a favorable route for the rapid transport of electrons for enhanced electrical conductivity.

In an alternative embodiment, the electrocatalyst of the present disclosure may be used in the field of batteries, fuel cells, photochemical cells, water splitting cells, electronics, water purification, hydrogen sensors, semiconductors (such as field effect transistors), magnetic semiconductors, capacitors, data storage devices, biosensors (such as redox protein sensors), photovoltaics, liquid crystal screens, plasma screens, touch screens, OLEDs, antistatic deposits, optical coatings, reflective coverings, anti-reflection coatings, and/or reaction catalysis.

EXAMPLES

The following examples demonstrate a method of generating oxygen using a solid-solution nickel-iron oxide (FeNiO$_x$) thin film electrocatalyst as described herein. The examples are provided solely for illustration and are not to be construed as limitations of the present disclosure, as many variations thereof are possible without departing from the spirit and scope of the present disclosure.

Example 1: Reagents and Materials

Iron (III) acetylacetonate (Fe(acac)$_3$), nickel (II) acetylacetonate (Ni(acca)$_2$), and methanol were purchased from Sigma-Aldrich. Nickel foam (1.6 mm thick and 95% porosity) was purchased from Good-fellow Cambridge Ltd. The water used throughout all experiments was Milli-Q water.

Example 2: Synthesis of FeNiO$_x$ Thin Films

The nickel foam (NF) strips of size (1 cm×2 cm) were pre-cleaned with diluted HCl, acetone, and ethanol for 10 min each in an ultrasonic bath. Then, the NF was rinsed with deionized water and blown with high-purity N$_2$ gas. The solid-solution of nickel-iron oxide (FeNiO$_x$) electrocatalyst support on Ni foam was prepared using self-designed aerosol-assisted chemical vapor deposition (AACVD), See Ehsan M A, Shah S S, Basha S I, Hakeem A S, Aziz M A. Recent Advances in Processing and Applications of Hetero-bimetallic Oxide Thin Films by Aerosol-assisted Chemical Vapor Deposition. The Chemical Record. 2021, incorporated herein by reference in its entirety. The precursor solution was obtained by mixing Fe(acac)$_3$ (100 mg, 0.283 mmol) and Ni(acac)$_2$ (73 mg, 0.283 mmol) in 15 mL of methanol and stirring for five minutes to obtain a homogeneous reddish solution. The as-obtained solution was converted into an aerosol mist using a medical-grade ultrasonic humidifier, and a mist stream was transferred into a horizontal tube furnace pre-heated to 475° C. The NF in the tube furnace was positioned to receive the precursor nebula directly above where the decomposition and CVD reactions took place to develop a layer of FeNiO$_x$. The deposition process was repeated for a period of 40 and 80 minutes, respectively, and the prepared samples were named FeNiO$_x$-40 and FeNiO$_x$-80, respectively.

Example 3: Structural Characterization Techniques

Scanning electron microscopy (SEM, TESCAN MIRA3, 21 Libušina T, Brno-Kohoutovice, 623 00, Czech Republic) coupled to an X-ray dispersive energy analyzer (EDX, INCA Energy 200, Oxford Instruments, Tubney Woods, Abingdon, Oxon, OX13 5QX, U.K) was used to study the morphology and composition of the as-synthesized FeNiO$_x$ catalyst. X-ray diffraction (XRD, Rigaku MiniFlex X-ray diffractometer, manufactured by Rigaku, 3 Chome-9-12 Matsubaracho, Akishima, Tokyo 196-8666, Japan) was used to measure the crystalline pattern of the films over a 20 range of 20-90°. The TEM measurement analysis was performed using JEOL-JEM2100F, Japan, operating at an acceleration voltage of 200 kV. X-ray photoelectron spectroscopy (XPS, Thermo Scientific EscaLab 250Xi, 168 Third Avenue. Waltham, MA USA 02451) with an Al Kα (1486.6 eV) source was performed to examine the chemical composition and valence states. The electron beam was calibrated with C 1$s$ (284.6 eV) as standard.

Example 4: Electrochemical Measurement Techniques

Electrochemical studies were performed using an INTER-FACE 1010 E computer-controlled potentiostat workstation. The electrochemical three-electrode setup was made using platinum (Pt) mesh, Ag/AgCl, and the FeNiO$_x$ electrodes fabricated on nickel foam as the counter, reference, and working electrodes, respectively immersed in 1.0 M KOH electrolyte. All measured potentials were converted to the reversible hydrogen electrode (RHE). Catalytic activation was achieved with a cyclic voltammetry (CV) test performed at a scan rate of 50 m Vs$^{-1}$ in the potential range of 1-2 V (vs. RHE). The linear sweep voltammetry (LSV) test was recorded at a scan rate of 1 mVs$^{-1}$, and the data obtained are reported without iR corrections. All measured potentials were converted to the reversible hydrogen electrode (RHE). Electrochemical impedance spectroscopy (EIS) was investigated at a potential of 1.55 V in the frequency range from 0.01 Hz to 100 kHz. The chronopotentiometry (CP) method was used to evaluate the catalytic durability of the prepared samples at the current densities of 50 and 100 mAcm$^{-2}$. The electrochemically active surface area (ECSA) was calculated using the following relationship:

$$ESCA = \frac{C_{DL}}{C_S}$$

The double-layer capacitance (Cdl) of the samples was obtained by running consecutive CVs in the non-Faradic region of 40-160 mV at different scan rates of 10-60 mV sec$^{-1}$. Cs represents the specific capacitance of the metal electrodes, which is 0.04 cm$^2$ for alkaline electrolytes. The Cdl is determined from the cathodic and anodic slopes of the average current versus the sampling rate curve.

Example 5: Structural Characterization

Solid-solution nickel-iron oxide (FeNiO$_x$) thin films were prepared with the AACVD process conducted at 475° C. for time periods of 40 and 80 minutes, respectively. For XRD analysis, bimetallic oxide films were fabricated on a non-crystalline plain glass substrate instead of nickel foam. The crystalline contribution of nickel foam could cause interference with XRD patterns obtained from nickel-iron oxide samples.

Figure 2:
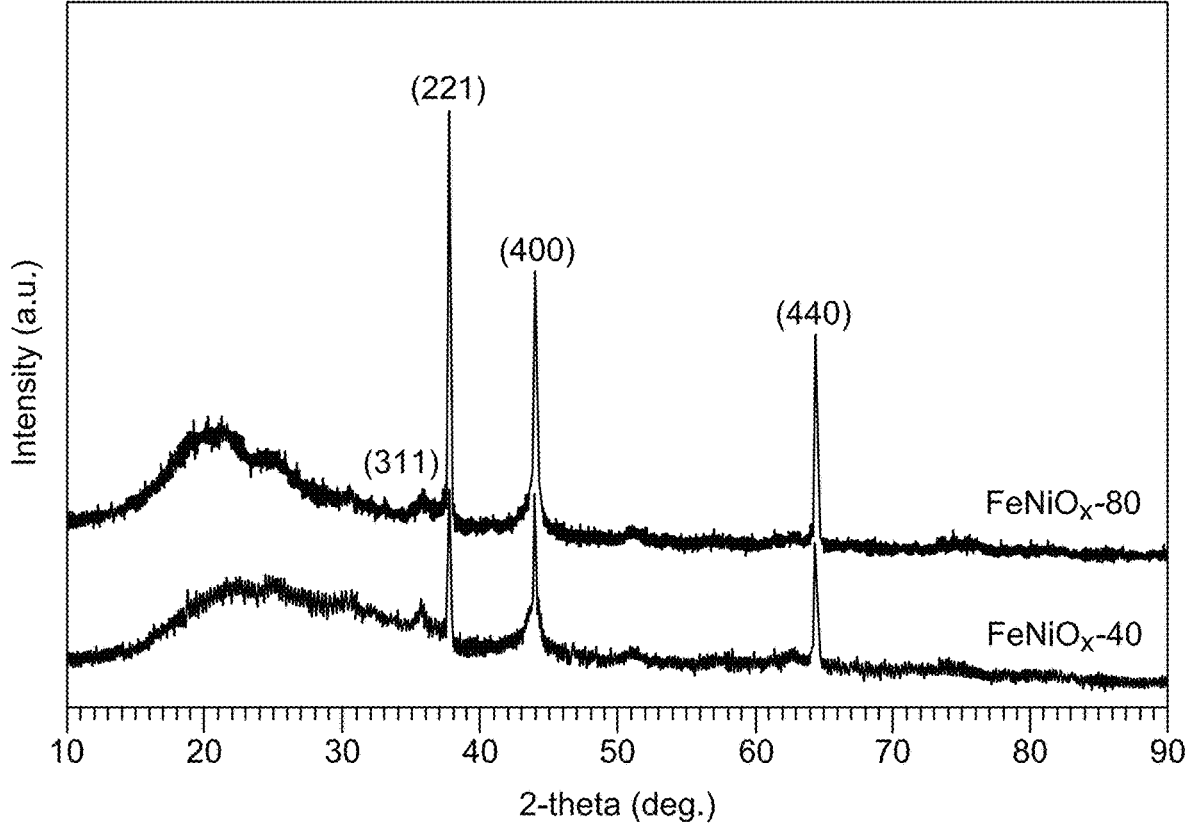
FIG. 2 is an X-ray diffraction (XRD) pattern of nickel-iron oxide solid-solution ($Ni_{1.25}Fe_{1.85}O_4$) films grown on a plain glass for a time period of 40 minutes (designated as $FeNiO_x$-40 thin-film electrocatalyst or $FeNiO_x$-40 catalyst) and 80 minutes (designated as $FeNiO_x$-80 thin-film electrocatalyst or $FeNiO_x$-80 catalyst), according to certain embodiments.

FIG. 2 shows the XRD patterns of as-deposited FeNiO$_x$ film samples on plain glass. Peaks appear at 20 values of 35.7°, 37.3°, 43.5°, and 64° are allocated with hkl values of (311), (222), (400), and (440), respectively. The observed XRD data show agreement with the standard solid-solution of nickel-iron oxide with the formula "Ni$_{1.25}$Fe$_{1.85}$O$_4$" (01-088-0380) in cubic phase and Fd-3m space group. There are no unidentified extra crystalline peaks, indicating the pure synthesis of the Ni$_{1.25}$Fe$_{1.85}$O$_4$ phase. The XRD peak patterns of both samples are completely overlapped, indicating the formation of a similar bimetallic Ni$_{1.25}$Fe$_{1.85}$O$_4$ phase.

Figures 3A, 3B, 3C, 3D, 3E, 3F:
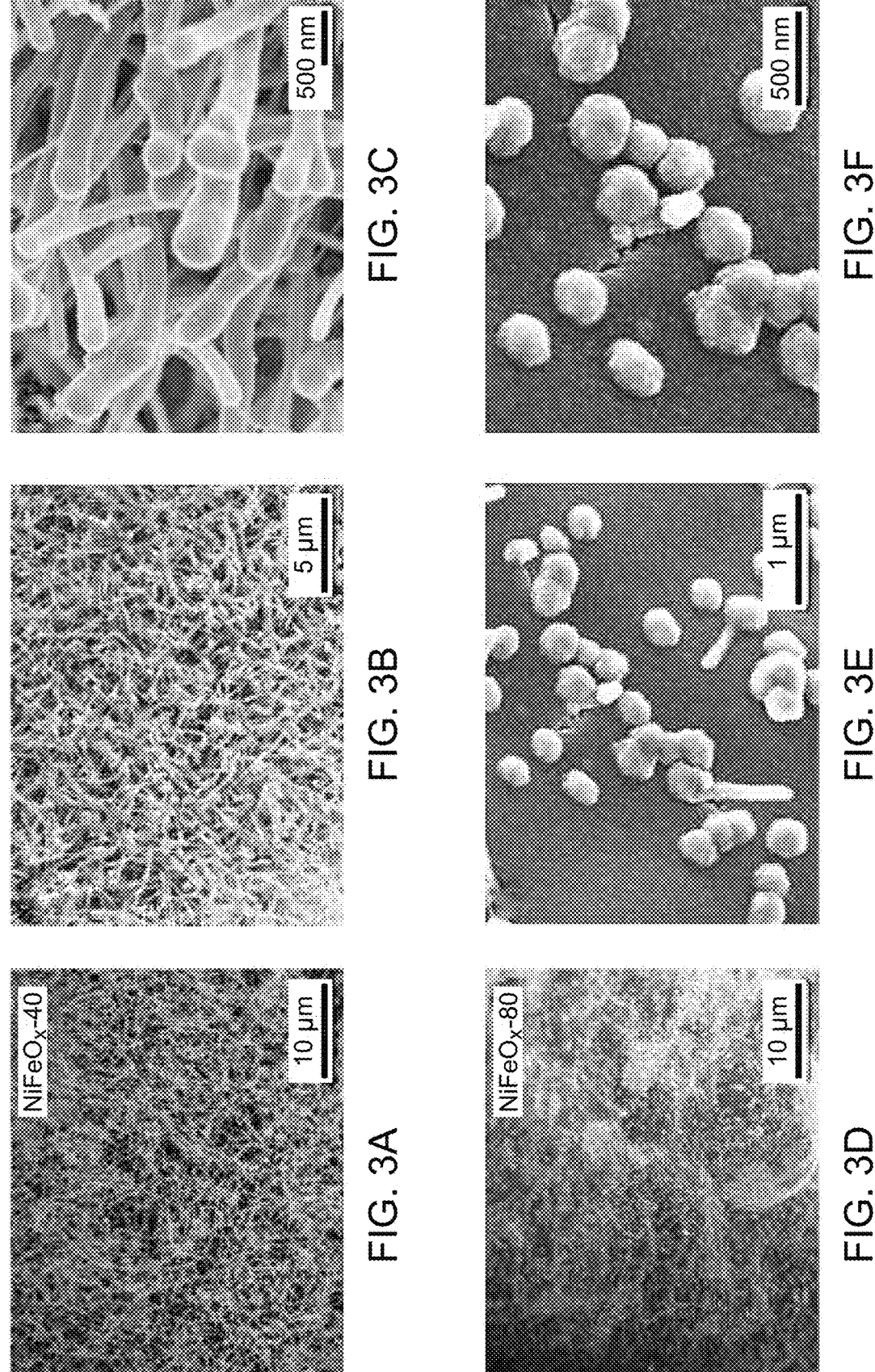
FIGS. 3A-3C shows scanning electron microscopic (SEM) images of the $FeNiO_x$-40 catalyst deposited on a nickel foam substrate at 10 μm scale, 1 μm, and 500 nm scale, respectively, according to certain embodiments.
FIGS. 3D-3F shows SEM images of the $FeNiO_x$-80 catalyst deposited on the nickel foam substrate at 10 μm scale, 1 μm, and 500 nm scale, respectively, according to certain embodiments.

The morphology of solid-solution FeNiO$_x$ catalyst film developed on NF was analyzed by scanning electron microscopy (SEM), as shown in FIG. 3. The catalyst obtained after 40 minutes shows the extended fibrous microstructure that resembles with bird's nest (FIG. 3A). At 1 μm scale, the sight of thick and tangled fibers became clear, and the nanorods-like morphology can be recognized (FIG. 3B). Further, at 100 nm scale, the texture of nanorods became clearly visible. The nanorods are developed in vertical directions with a length of several microns and a thickness of about 400 nm with a closed top end revealing the non-hollow nature. The surface of nanorods is decorated with tiny buds (FIG. 3C). The presence of tiny buds on nanorods improves catalytic activity. These tiny buds represent considerably larger active sites for water splitting compared to the bulk material. In addition, the interconnected porous structure can facilitate the fast diffusion of electrolytes, thereby accelerating the electrocatalytic reaction with the active sites on the bimetallic fibers. Overall, the interconnected and continuous fiber structure forms a network, which provides a favorable route for the rapid transport of electrons for enhanced electrical conductivity.

The FeNiO$_x$ catalyst prepared for 80 minutes showed a different microstructure. By increasing the sintering time, the former fibrous microstructure collapsed and settled into a layered structure (FIG. 3D), in which spherical objects emerged (FIG. 3E). From the high-resolution image, the remnants of nanorods can be seen along with spherical objects (FIG. 3F).

Figure 4A:
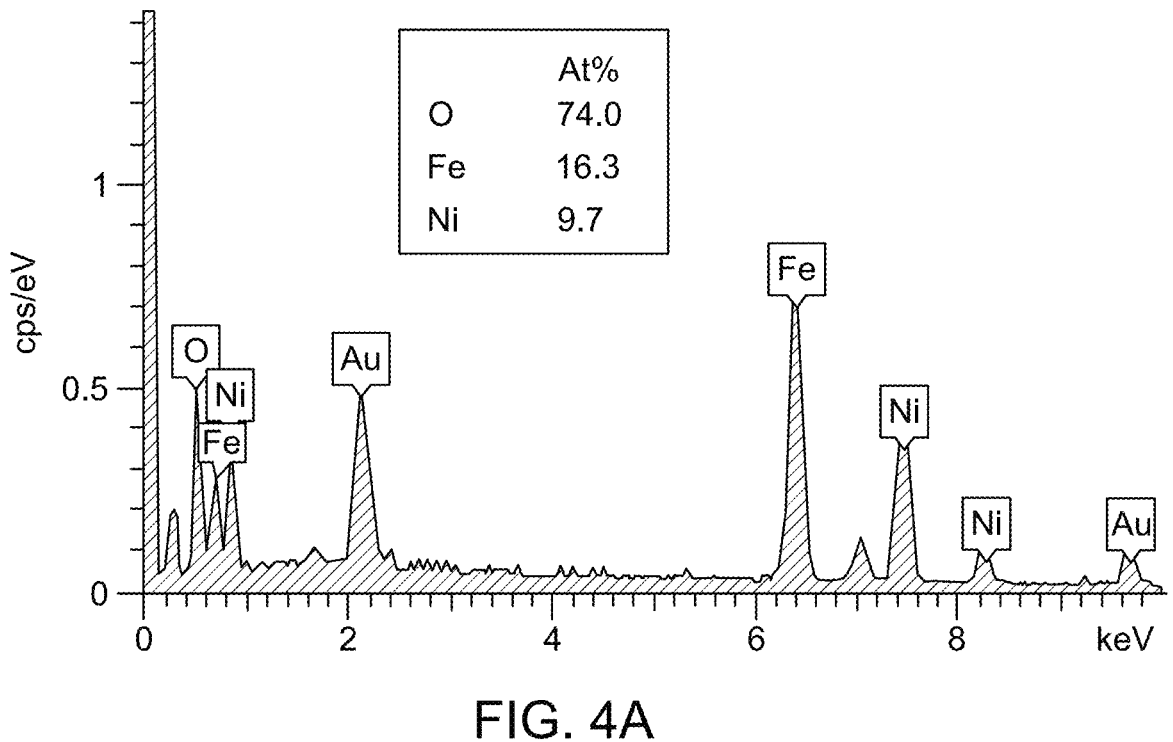
FIG. 4A is an energy dispersive X-ray spectroscopy (EDS) pattern of a $FeNiO_x$-40 catalyst with corresponding % atomicity values, according to certain embodiments.
Figure 4B:
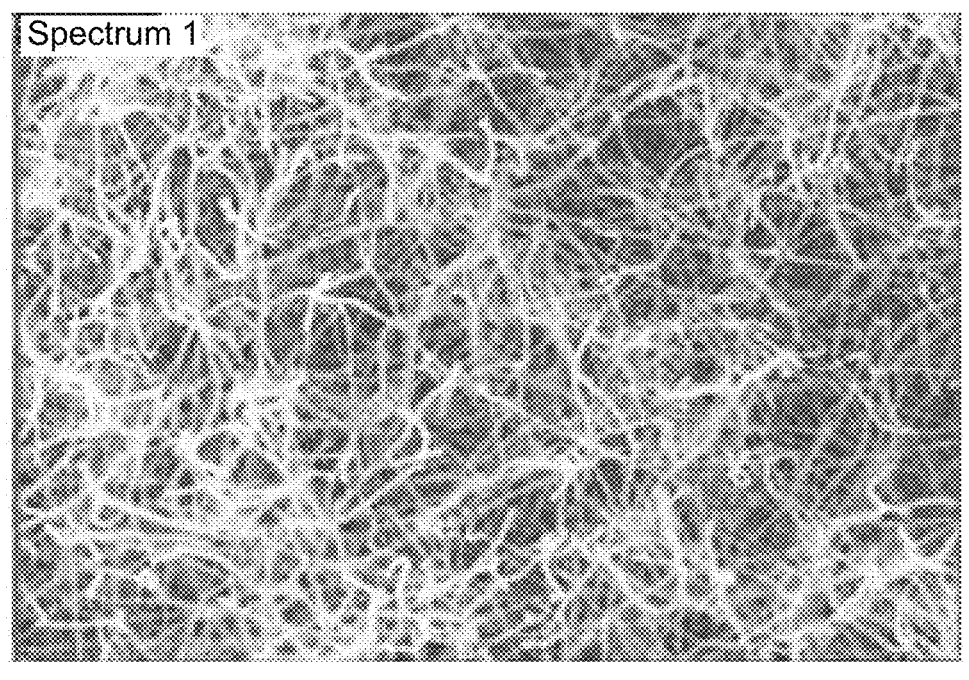
FIG. 4B is a corresponding spectrum of a $FeNiO_x$-40 catalyst, according to certain embodiments.
Figure 4C:
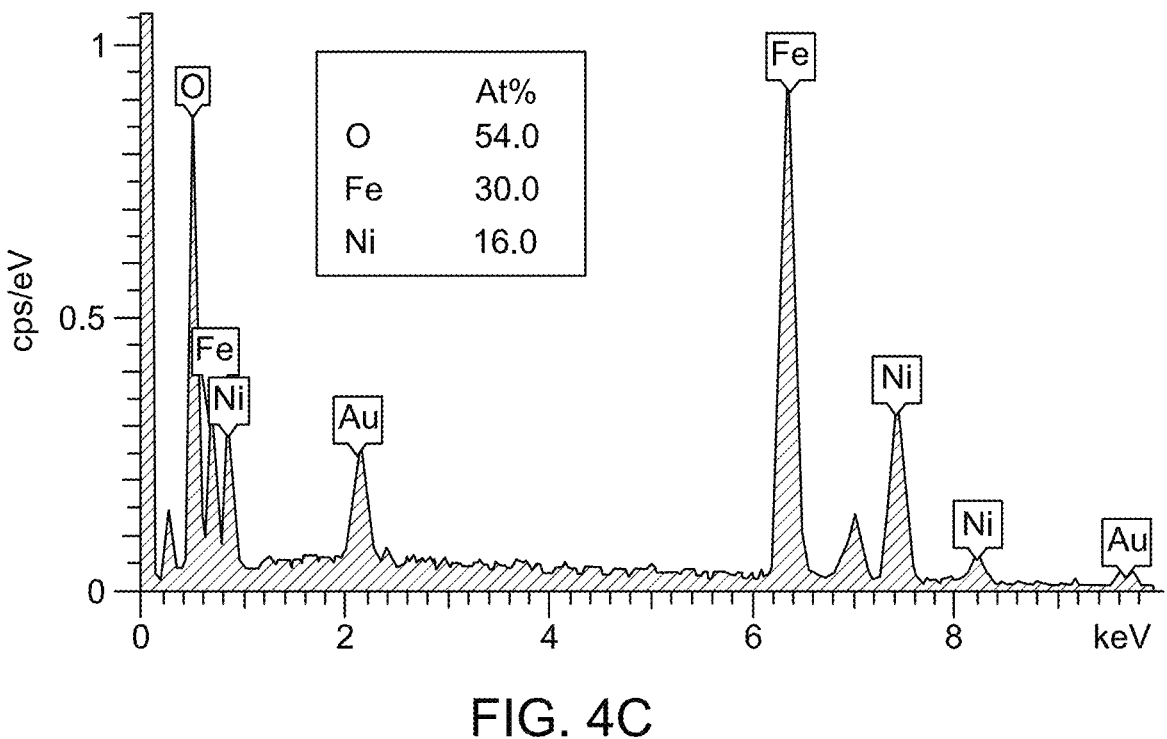
FIG. 4C is an EDS pattern of the $FeNiO_x$-80 catalyst with corresponding % atomicity values, according to certain embodiments.
Figure 4D:
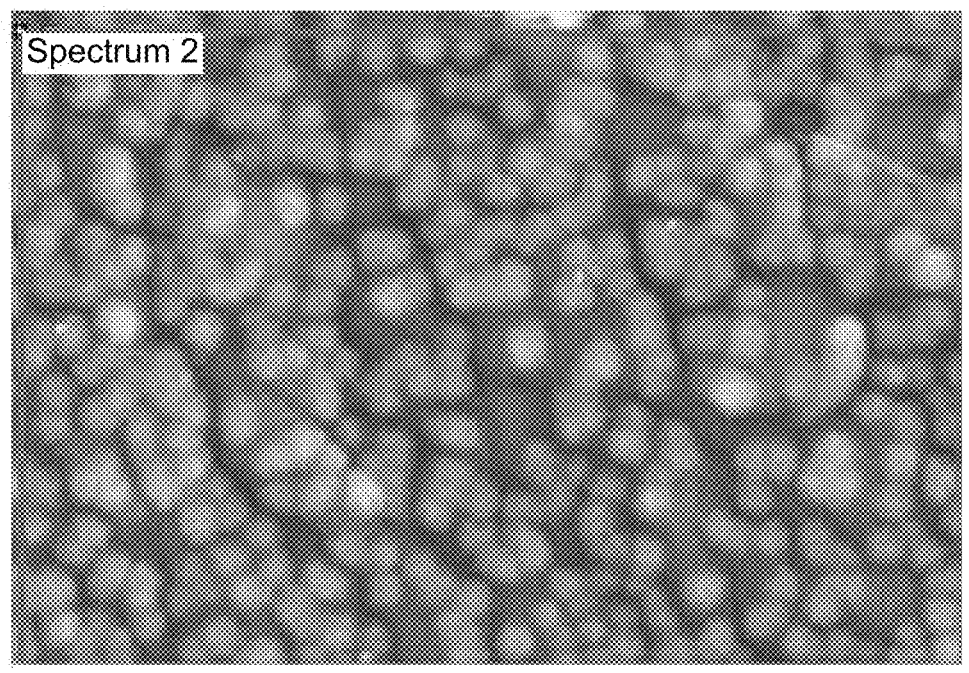
FIG. 4D is a corresponding spectrum of a $FeNiO_x$-80 catalyst, according to certain embodiments.
Figure 5A:
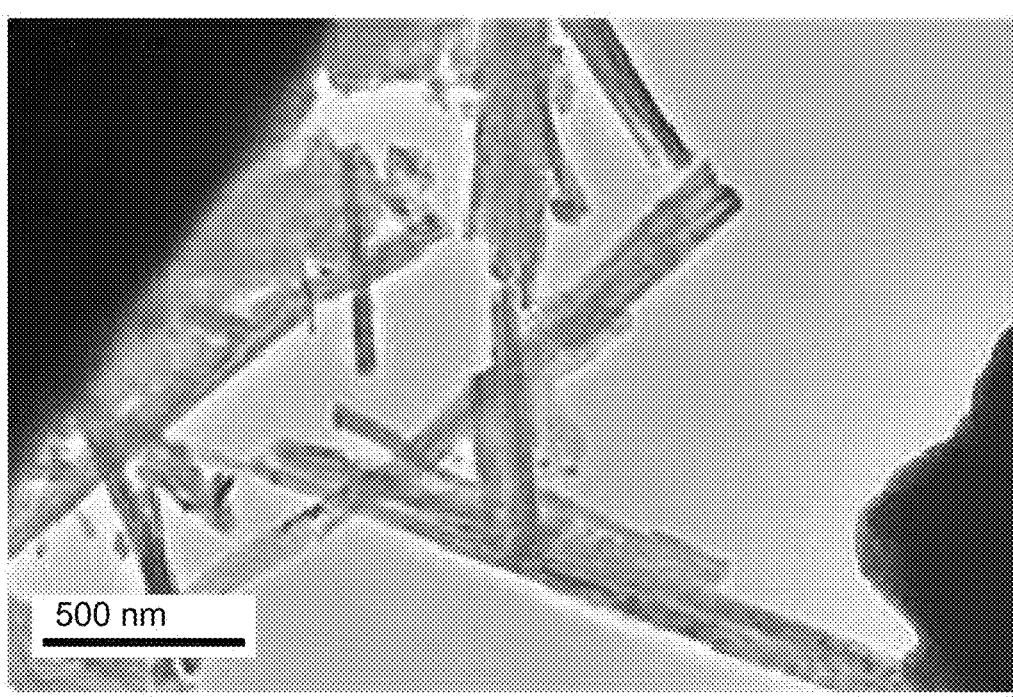
FIG. 5A shows a transmission electron microscopic (TEM) analysis of fibrous $FeNiO_x$ catalyst at 500 nm scale, according to certain embodiments.
Figure 5B:
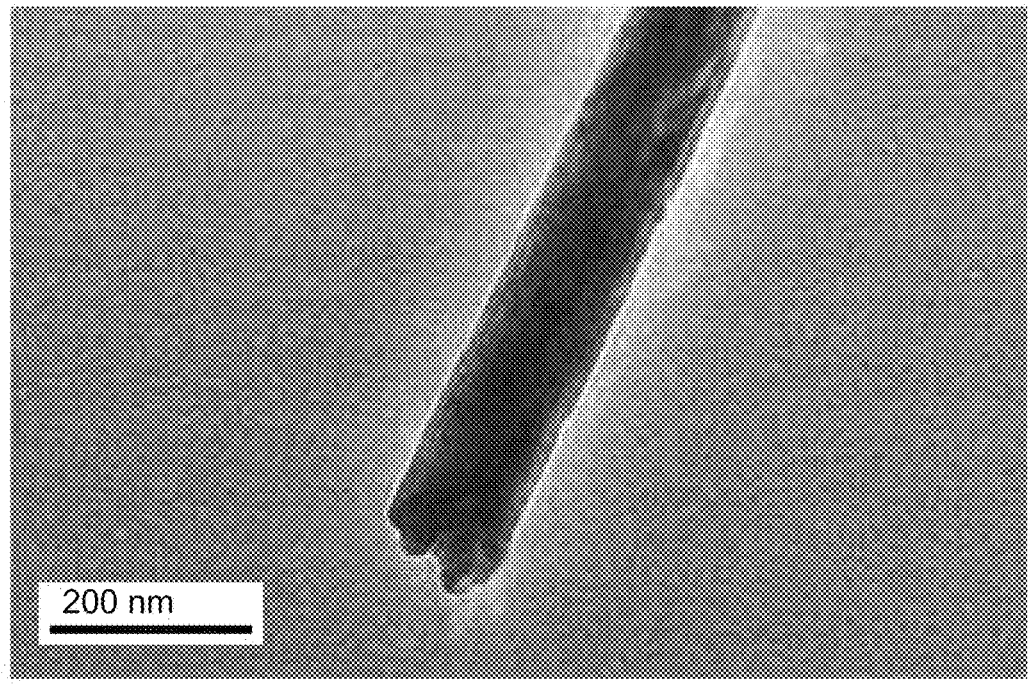
FIG. 5B shows a TEM analysis of the fibrous $FeNiO_x$ catalyst at 200 nm scale, according to certain embodiments.
Figure 5C:
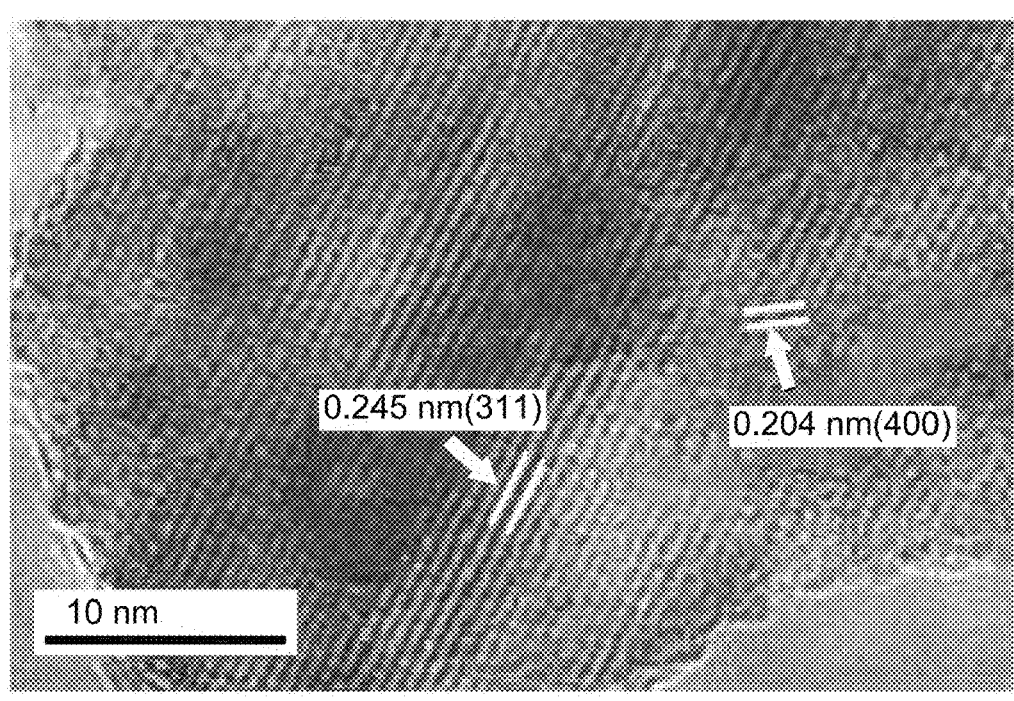
FIG. 5C shows a high-resolution transmission electron microscope (HR-TEM) image at 10 nm presenting lattice fringes of $Ni_{1.25}Fe_{1.85}O_4$ solid-solution, according to certain embodiments.
Figure 5D:
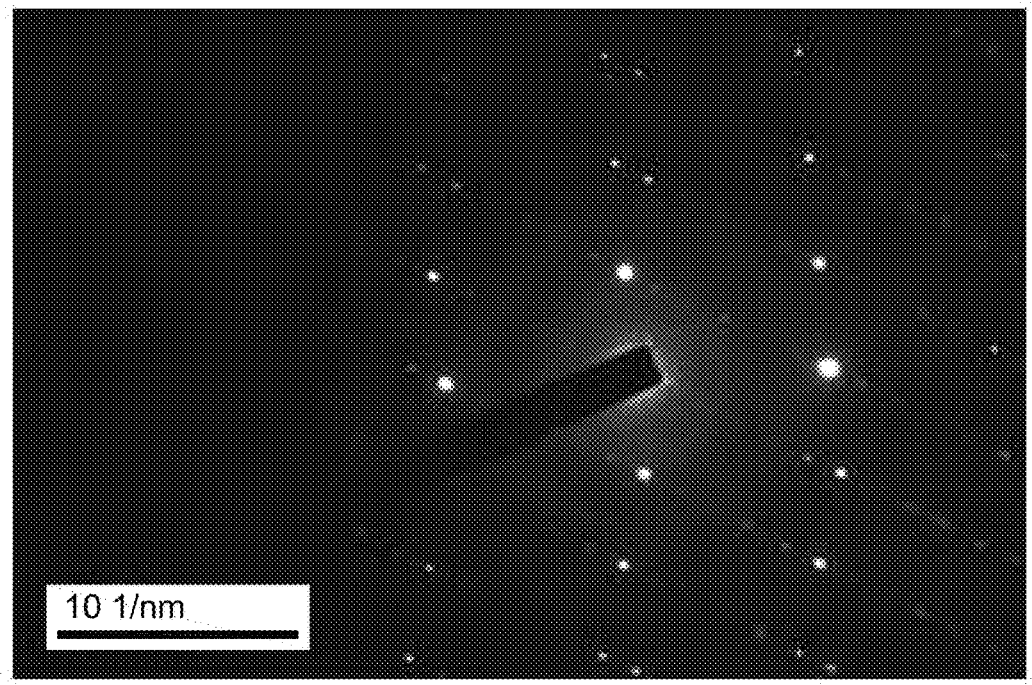
FIG. 5D shows a Selected Area Electron Diffraction (SAED) image showing the parallel line formation for a monocrystalline nature of $Ni_{1.25}Fe_{1.85}O_4$, according to certain embodiments.

EDX analysis was performed to determine the composition of the FeNiO$_x$ catalyst film. For this, the catalyst film prepared on plain glass support was used to avoid the addition of Ni from the nickel foam substrate, which otherwise increase the concentration of Ni present in the as-synthesized catalyst samples. The presence of Fe, Ni, and O elements shows the synthesis of FeNiO$_x$ catalysts, and the Au peaks are attributed to the gold coating used to avoid the charging effect under SEM. The elemental stoichiometry between Ni/Fe is calculated to be 1:1.68 and 1:1.87 for the films grown for 40 minutes (FIG. 4A) and 80 minutes (FIG. 4B), respectively, which is very close to the chemical formula "Ni$_{1.25}$Fe$_{1.85}$O$_4$" recognized from XRD analysis. The spectrum for the FeNiO$_x$-40 catalyst is shown in FIG. 4B and spectrum for FeNiO$_x$-80 catalyst is shown in FIG. 4D.

The fibrous microstructure of FeNiO$_x$ was further characterized by TEM analysis (FIG. 5A-FIG. 5D). The nanorod-shaped morphology found in TEM images (FIG. 5A and FIG. 5B), indicates a good correlation with the SEM result. TEM images show that some nanorods are even longer than 1 μm, which could not be observed in the SEM image due to its lower magnification than TEM. A high-resolution TEM image of the nanorods (FIG. 5C) shows many fringes on its surface. The values of the characterised-spacings are 0.245 and 0.204 nm, respectively, which correspond well to the (311) and (400) lattice planes of the solid-solution Ni$_{1.25}$Fe$_{1.85}$O$_4$ detected by XRD. It is shown that Ni$_{1.25}$Fe$_{1.85}$O$_4$ is in the form of a solid solution. Furthermore, the typical diffraction rings in the selected area electron diffraction (SAED) pattern (FIG. 5D) demonstrate the single-crystal nature of the Ni$_{1.25}$Fe$_{1.85}$O$_4$ solid solution.

Figure 6A:
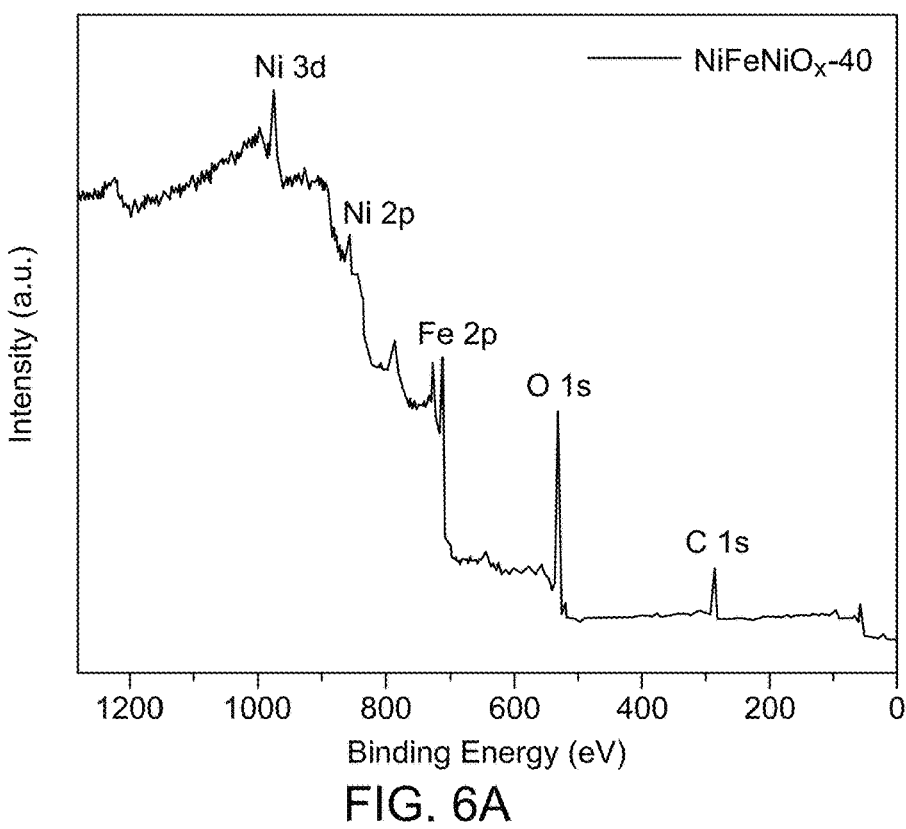
FIG. 6A is an X-ray photoelectron spectroscopy (XPS) survey scan of the fibrous $FeNiO_x$ catalyst prepared after 40 minutes of aerosol-assisted chemical vapor deposition (AACVD) process; according to certain embodiments.
Figure 6B:
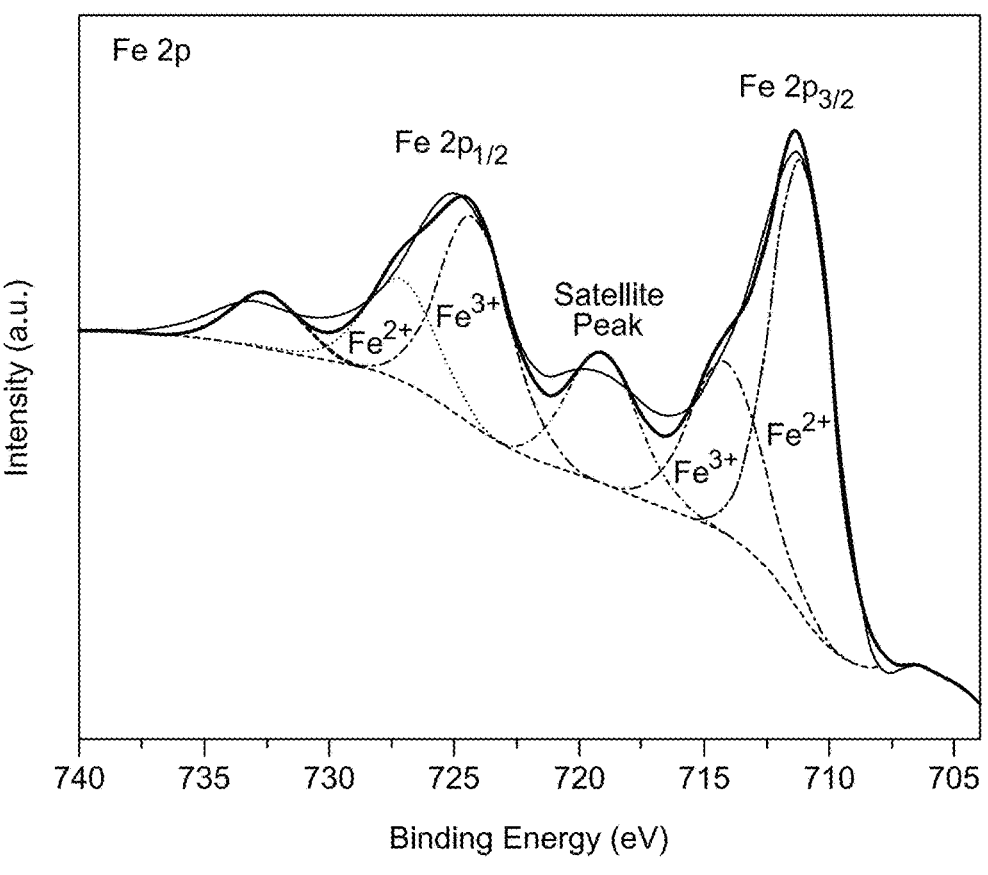
FIG. 6B is an XPS spectra of Fe2p region of the fibrous $FeNiO_x$ catalyst prepared after 40 minutes of the AACVD process; according to certain embodiments.

The fibrous FeNiO$_x$ catalyst was further analyzed by X-ray photoelectron spectroscopy (XPS) to investigate the surface chemical composition and the electronic structures of the elements. The XPS survey spectrum (FIG. 6A) shows that the catalyst surface consists of Ni, Fe, and O elements, as evident from the EDX analysis. The high-resolution XPS spectrum of Fe 2p (FIG. 6B) shows two spin-orbit doublets, representing the typical bands of Fe 2p$_{3/2}$ (Fe$^{2+}$ and Fe3+ located at ~711 and 714.7 eV, respectively) and Fe2p$_{1/2}$ (Fe$^{2+}$ and Fe$^{3+}$ locate at 724.2 and 727.7 eV respectively), accompanied by a satellite peak at 719 eV.

Figure 6C:
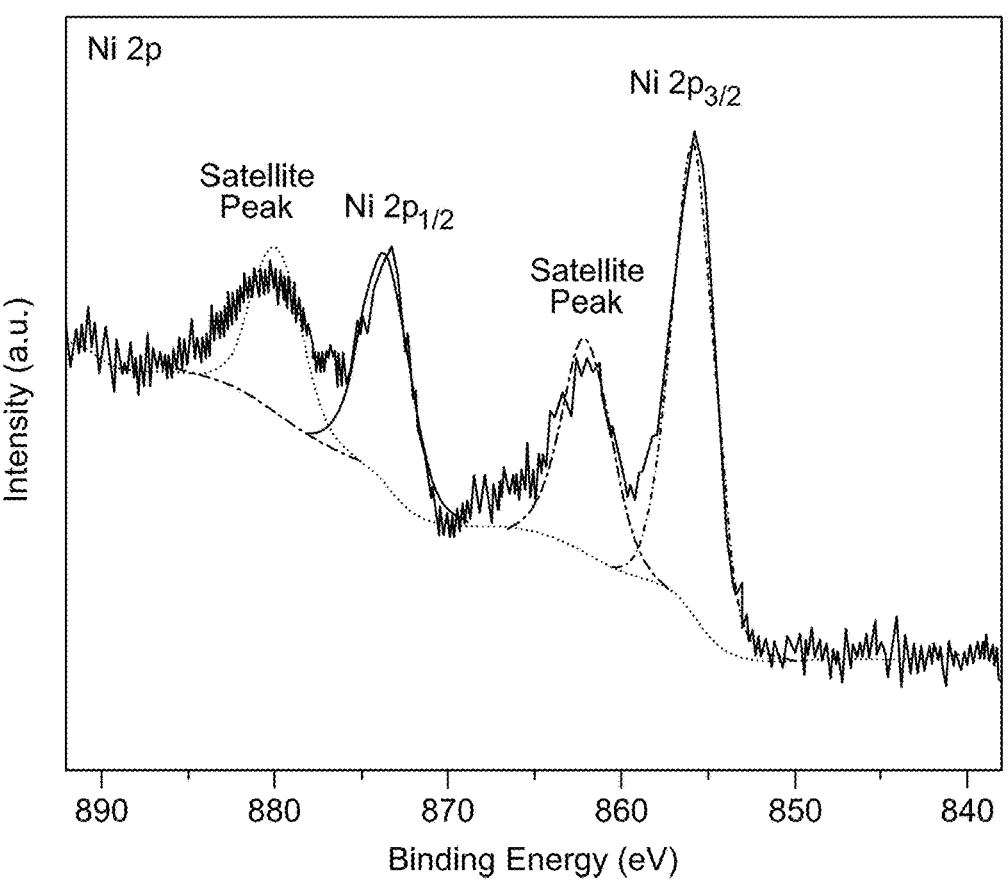
FIG. 6C is an XPS spectra of Ni2p region of the fibrous $FeNiO_x$ catalyst prepared after 40 minutes of the AACVD process; according to certain embodiments.
Figure 6D:
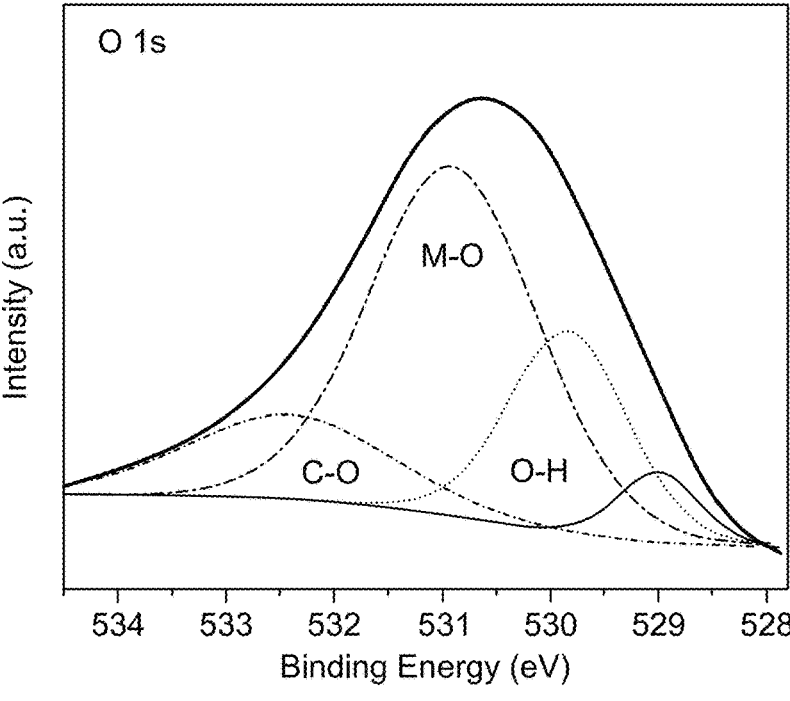
FIG. 6D is an XPS spectra of O1s region of the fibrous $FeNiO_x$ catalyst prepared after 40 minutes of the AACVD process; according to certain embodiments.

The high-resolution XPS spectrum of Ni 2p shows two spin-orbit doublets at 855.9 and 873.8 eV, corresponding to the characteristic peaks of Ni 2p$_{3/2}$ and Ni 2p$_{1/2}$, respectively; the satellite peaks located at 862.1 and 880.1 eV are also assigned to Ni 2p$_{3/2}$ and Ni 2p$_{1/2}$ orbitals of Ni$^{2+}$ respectively (FIG. 6C). Consistent with the chemical state of the surface metal, the surface O atoms contain three types of oxygen: —OH(529.9 eV), M-O (530.9 eV), and C—O (532.2 eV), as can be observed in FIG. 6D.

Example 6: Electrochemical Water Oxidation Study

The electrochemical analysis of the as-synthesized FeNiO$_x$ electrocatalysts was evaluated in a conventional three-electrode electrochemical cell setup in 1 M KOH solution. First, a cyclic voltammetry (CV) test was performed to activate the FeNiO$_x$ catalysts by continuously running 40 CVs between 0.0 and 0.8 V (versus NHE) at a scan rate of 50 mV s$^{-1}$. As shown in FIG. 7A-FIG. 7D, the CV curves for both FeNiO$_x$-40 and FeNiO$_x$-80 show redox couple peaks indicative of the conversion of Ni(II) to Ni(III) in alkaline media, followed by the oxidation current peak as the result of oxygen evolution reaction. Within 40 CV cycles (FIG. 7B), the redox peak became very strong, indicating the gradual oxidation of Ni$^{2+}$ to Ni$^{3+}$ at 0.4 V and the gradual reduction of Ni$^{3+}$ to Ni$^{2+}$ at 0.32 V (inset in FIG. 7B-FIG. 7D). Meanwhile, the redox peak area gradually increased after CV cycling. From this, it can be deduced that during the alkaline OER process, FeNiO$_x$ is continuously converted to FeNiOOH, which serves as the catalytic active site. FIG. 7D indicates the comparison between the 40th cycle of both FeNiO$_x$ catalysts. It can be observed that the oxidation peak area of FeNiO$_x$-40 (FIG. 7B) is larger than that of FeNiO$_x$-80 (FIG. 7C), indicating that the FeNiO$_x$-40 catalyst is stronger than FeNiO$_x$-80 due to the generation of more catalytic active sites. However, the activation of bare nickel foam (FIG. 7A) performed under similar electrochemical conditions was not very high.

FIG. 8A shows the polarization curves of the activated FeNiO$_x$ electrocatalysts. The electrocatalytic OER performance of bare NF was also investigated under the same test conditions. Bare Ni foam shows the poorest catalytic activity within the studied potential window. The LSV polarization curves of both FeNiO$_x$ catalysts demonstrate excellent OER performance as both catalysts approached a higher current density (j) of 1000 mAcm$^{-2}$. More importantly, FeNiO$_x$-40 requires a lower potential to obtain the same OER current density compared to FeNiO$_x$-80. The FeNiO$_x$-40 catalyst consumes 16 mV lower overpotential (226 mV) than FeNiO$_x$-80 (242 mV) at a current density of 10 mA/cm$^2$ (FIG. 8B). Furthermore, a small overpotential of 365 mV can induce a high OER j of 1000 mA cm$^{-2}$, while FeNiO$_x$-80 needs an overpotential of about 434 m V to obtain the current density (FIG. 8C). These OER performance of FeNiO$_x$-40 is closely related to its fibrous microstructure, which leads to a larger surface area and shorter ion diffusion length.

In addition, the Tafel slope is an inherent property of the electrocatalyst that describes its potential for OER. To evaluate the OER kinetics of as-synthesized FeNiO$_x$ catalysts, their Tafel slopes were derived from the corresponding LSV curves. This can be done by fitting the linear region of LSV plot to the Tafel equation:

$$\eta = a + b \log j$$

In the above formula, n represents the overpotential, a is the intersection point, b is the Tafel slope, and j is the current density. The Tafel slope is inversely related to the charge transfer factor, which means that the lower the Tafel slope, the faster the charge transfer on the catalyst surface. The Tafel slopes of FeNiO$_x$ samples are shown in FIG. 8D. The FeNiO$_x$-40 exhibits a Tafel slope value of 64 m V/dec, lower than that of 84 m V/dec for FeNiO$_x$-80, demonstrating its faster OER kinetics. In addition, the Tafel slope of bare nickel foam is as high as 119 mV/dec.

To further evaluate the OER kinetics, electrochemical impedance spectroscopy (EIS) was performed to examine the charge transfer resistance (R$_{ct}$) with a test potential of 0.55 V vs Ag/AgCl and a frequency sweep from 100 kHz to 0.1 Hz. In the Nyquist plot for EIS, the diameter of the semicircle represents R$_{ct}$. As shown in FIG. 9A, the FeNiO$_x$-40 electrocatalyst has the smallest semicircle diameter, indicating the smallest Rot value (~6Ω). Furthermore, the Ret of FeNiO$_x$-80 (~8Ω) is more than one-fold that of the FeNiO$_x$-40. Subsequently, a larger Faradaic resistance was obtained from the bare NF electrode (black). The inset of FIG. 9A shows the Randles circuit diagram used for fitting the EIS data and studying charge transfer resistance values, of the catalysts. The above observations indicates that the fibrous-structured FeNiO$_x$-40 with more active sites and larger active surface area has a faster charge transfer rate due to the high kinetics of OER. Furthermore, the intrinsic catalytic activity of FeNiO$_x$ catalysts for OER was determined by measuring the turnover frequency (TOF). The following relationship is used for TOF calculations:

$$TOF = \frac{JXA}{4XFXm}$$

where J is the current density obtained at different overpotentials, A is the geometric surface area of the NiF substrate (1 cm$^{-2}$), F is the Faraday constant (96,485 C mol$^{-1}$), and m is the number of moles of catalyst deposited on the NiF substrate. The mass of the FeNiO$_x$ catalyst deposited by AACVD was found to be 0.08, and 0.23 mg for FeNiO$_x$-40 and FeNiO$_x$-80, respectively. The TOF values of FeNiO$_x$ catalysts were calculated directly from polarization curves at different overpotentials and are shown in FIG. 9B. The TOF values determined at 350 mV are found to be 2.0 s$^{-1}$ and 0.8 s$^{-1}$ for FeNiO$_x$-40 and FeNiO$_x$-80, respectively. The higher TOF value of the FeNiO$_x$-40 catalyst indicates higher intrinsic activity as compared to the FeNiO$_x$-80 catalyst to perform OER with improved kinetics.

For practical electrochemical applications, stability is another criterion besides the electrocatalytic activity of OER electrocatalysts. To ascertain the practical applicability of the FeNiO$_x$ catalyst, a chronopotentiometry test was performed in 1.0 M KOH solution at current densities of 50 and 100 mAcm$^{-2}$ for 40 hours. As shown in FIG. 9C, the catalyst worked efficiently at both applied current densities and remained stable even after 40 h of operation, indicating its good stability and durability in an alkaline medium. When a current density of 50 mAcm$^{-2}$ was applied and kept constant for the first 20 h, an overpotential value of ~263 mV (vs RHE) was obtained and remained constant during this phase. As the current density increased from 50 to 100 mA/cm$^2$, the overpotential changed slightly from ~263 mV to ~292 mV and remained almost constant over the next 20 h. The polarization curves of the FeNiO$_x$-40 catalyst before and after the endurance test are shown in FIG. 9D. A polarization curve of the FeNiO$_x$-40 electrode before and after the long-term stability test (40 h) are almost identical, which proves their good stability even after prolonged water oxidation activity.

Finally, Table 1 compares water oxidation parameters of different types of bimetallic Fe—Ni alloy oxide/phosphide synthesized by various methods on different substrates. The bimetallic oxide thin film catalyst of the present disclosure has a higher current density of 1000 mAcm$^{-2}$ compared to the other electrocatalysts.

TABLE 1

Comparative analysis of different iron-nickel (Fe—Ni) bimetallic catalysts
prepared by different fabrication routes for water oxidation reaction in 1.0M KOH.

| Catalyst/System[a] | Support | Synthetic strategy | Potential [mV]@50 mA/cm$^2$ | Peak current density mA/cm$^2$ | Tafel slope [mV dec$^{-1}$] | Ref. |
|---|---|---|---|---|---|---|
| FeNiO$_x$-40 | NF | AACVD | 250 | >1000 | 64 | This work |
| (Fe$_{0.5}$Ni$_{0.5}$)2P/CC electrode | CC | Dip coating and phosphorization | 260 | >120 | 45 | [32] |
| Fe$_{0.4}$Ni$_{0.6}$ alloy | NF | Heat treatment process | 261 | 120 | 67 | [55] |
| Fe—Ni—O$_x$ NPs | NF | aerosol spray approach | 315 | >80 | 38 | [29] |
| Ni—Fe nano urchin | Cu foil | electrodeposition | 325 | 350 | 86 | [62] |
| Magnetite (Fe$_3$O$_4$) thin film | NF | AACVD | 300 | 1000 | 65 | [61] |
| Metallic Ni thin film | NF | AACVD | 310 | 1000 | 73 | [47] |
| IrO$_2$ | Glass carbon | Commercial | 301 | >170 | 75 | [63] |
| RuO$_2$ | NF | Commercial | 322 | 400 | 55 | [64] |

[32] - Wu D, Kong A, Li W, Fu Y, Zhang J. Facile synthesis of bimetallic Ni—Fe phosphide as robust electrocatalyst for oxygen evolution reaction in alkaline media. International Journal of Hydrogen Energy. 2021; 46: 39844-54.
[55] - Zhang G, Zeng J, Yin J, Zuo C, Wen P, Chen H, et al. Iron-facilitated surface reconstruction to in-situ generate nickel-iron oxyhydroxide on self-supported FeNi alloy fiber paper for efficient oxygen evolution reaction. Applied Catalysis B: Environmental. 2021; 286: 119902.
[29] - Wang L, Geng J, Wang W, Yuan C, Kuai L, Geng B. Facile synthesis of Fe/Ni bimetallic oxide solid-solution nanoparticles with superior electrocatalytic activity for oxygen evolution reaction. Nano research. 2015; 8: 3815-22.
[62] - Hatami E, Toghraei A, Darband G B. Electrodeposition of Ni—Fe micro/nano urchin-like structure as an efficient electrocatalyst for overall water splitting. International Journal of Hydrogen Energy. 2021; 46: 9394-405.
[61] - Ehsan M A, Babar N-U-A. Straightforward Preparation of Fe-Based Electrocatalytic Films at Various Substrates for IrO2-like Water Oxidation Activity. Energy & Fuels. 2023.
[47] - Ehsan M A, Ullah Z, Nazar M F, Younas M, Suliman M. One step fabrication of nanostructured nickel thin films on porous nickel foam for drastic electrocatalytic oxygen evolution. International Journal of Hydrogen Energy. 2023.
[63] - Lin Y, Zhou S, Sheehan S W, Wang D. Nanonet-based hematite heteronanostructures for efficient solar water splitting. Journal of the American Chemical Society. 2011; 133: 2398-401.
[64] - Zhu Y-X, Jiang M-Y, Liu M, Wu L-K, Hou G-Y, Tang Y-P. An Fe-V@ NiO heterostructure electrocatalyst towards the oxygen evolution reaction. Nanoscale. 2020; 12: 3803-11.

Numerous modifications and variations of the present disclosure are possible in light of the above teachings. It is therefore to be understood that within the scope of the appended claims, the invention may be practiced otherwise than as specifically described herein.

The invention claimed is:

1. A method of generating oxygen, comprising:
applying a potential of greater than 0 to 2.0 V to an electrochemical cell,
wherein the electrochemical cell is at least partially submerged in an aqueous solution,
wherein on applying the potential the aqueous solution is oxidized thereby forming oxygen,
wherein the electrochemical cell comprises:
an electrocatalyst; and
a counter electrode;
wherein the electrocatalyst comprises:
a nickel foam substrate; and
a layer of particles of FeNiO$_x$ on a surface of the nickel foam substrate, wherein x=3-4,
wherein the particles of FeNiO$_x$ have a nanorod shape with an average diameter of 100-500 nanometers (nm) and a length longer than 500 nm, and
wherein a terminal end of the nanorod shape has a cap with a hemispherical shape having a diameter larger than the average diameter of the nanorod shape.

2. The method of claim 1, wherein the FeNiO$_x$ has a formula of Ni$_{1.25}$Fe$_{1.85}$O$_4$.

3. The method of claim 1, wherein the particles of FeNiO$_x$ have a nanorod shape with a length of 1-10 μm.

4. The method of claim 1, wherein the cap with the hemispherical shape has a diameter that is 20-60 nm larger than the diameter of the nanorod shape.

5. The method of claim 1, wherein the particles of FeNiO$_x$ are not hollow.

6. The method of claim 1, wherein the particles of FeNiO$_x$ are randomly oriented on the surface of the nickel foam substrate and form an interconnected and continuous fiber network.

7. The method of claim 1, wherein the particles of FeNiO$_x$ comprise 60-80 at. % O, 10-20 at. % Fe, and 5-15 wt. % Ni, based on a total number of atoms in the FeNiO$_x$.

8. The method of claim 1, wherein the electrocatalyst has an overpotential of 210-240 millivolts (mV) for a current density of 10 milliampere per square centimeter (mA cm$^{-2}$).

9. The method of claim 8, wherein the overpotential does not vary by more than 5% after the potential is applied for 2-50 hours.

10. The method of claim 1, wherein the electrocatalyst has a current density of at least 1,000 mA cm$^{-2}$ at 1.6 V.

11. The method of claim 1, further comprising:
forming the electrocatalyst by:
mixing a nickel salt and an iron salt in a solvent to form a homogeneous solution; and
depositing the homogeneous solution on the nickel foam substrate by aerosol-assisted chemical vapor deposition (AACVD) at a temperature of 400-600° C. to form the electrocatalyst.

12. The method of claim 11, wherein the depositing is carried out for 10-100 minutes.

13. The method of claim 11, wherein in the mixing the nickel salt and the iron salt are present in a 1-10:1-10 molar ratio.

14. The method of claim 1, wherein the electrocatalyst consists of FeNiO$_x$ on the surface of the nickel foam substrate.

15. The method of claim 1, wherein the aqueous solution comprises at least one base selected from the group consisting of an alkaline earth metal hydroxide and an alkali metal hydroxide.

16. The method of claim 15, wherein the base is potassium hydroxide.

17. The method of claim 1, wherein the counter electrode is made from a material selected from the group consisting of platinum, gold, and carbon.

18. The method of claim 1, wherein 80-99% of the nickel foam substrate is porous.

* * * * *